(12) United States Patent
Zarabadi et al.

(10) Patent No.: US 12,457,717 B2
(45) Date of Patent: Oct. 28, 2025

(54) SYSTEMS AND METHODS FOR DECOUPLING CAPACITOR FOR INVERTER FOR ELECTRIC VEHICLE

(71) Applicant: BorgWarner US Technologies LLC, Wilmington, DE (US)

(72) Inventors: Seyed R. Zarabadi, Kokomo, IN (US); Mark Wendell Gose, Kokomo, IN (US); David Paul Buehler, Noblesville, IN (US)

(73) Assignee: Borg Warner US Technologies LLC, Wilmington, DE (US)

( * ) Notice: Subject to any disclaimer, the term of this patent is extended or adjusted under 35 U.S.C. 154(b) by 248 days.

(21) Appl. No.: 18/162,009

(22) Filed: Jan. 31, 2023

(65) Prior Publication Data
US 2024/0106371 A1 Mar. 28, 2024

Related U.S. Application Data

(60) Provisional application No. 63/378,601, filed on Oct. 6, 2022, provisional application No. 63/377,512, filed
(Continued)

(51) Int. Cl.
*H02M 7/5387* (2007.01)
*B60L 3/00* (2019.01)
(Continued)

(52) U.S. Cl.
CPC ........... *H02M 7/5387* (2013.01); *B60L 3/003* (2013.01); *B60L 15/007* (2013.01); *B60L 15/08* (2013.01);
(Continued)

(58) Field of Classification Search
CPC .......... H02P 29/68; H02P 27/08; B60L 50/60; B60L 50/40
(Continued)

(56) References Cited

U.S. PATENT DOCUMENTS

| 4,054,828 A | 10/1977 | Conzelmann et al. |
| 4,128,801 A | 12/1978 | Gansert et al. |

(Continued)

FOREIGN PATENT DOCUMENTS

| WO | 2007093598 A1 | 8/2007 |
| WO | 2019034505 A1 | 2/2019 |

(Continued)

OTHER PUBLICATIONS

Maniar, K., et al., "Addressing High-voltage Design Challenges With Reliable and Affordable Isolation Technologies," 2024, pp. 1-12. Retrieved from internet URL: https://www.ti.com/lit/wp/slyy204c/slyy204c.pdf ts=1710508127616&ref_url=https%253A%252F%252Fwww.google.com%252F.

(Continued)

*Primary Examiner* — Kawing Chan
(74) *Attorney, Agent, or Firm* — Joshua M. Haines; Bookoff McAndrews, PLLC

(57) ABSTRACT

A system includes: an inverter configured to convert DC power from a battery to AC power to drive a motor, wherein the inverter includes: a first decoupling capacitor configured to be connected to a positive connection of the battery and a negative connection of the battery; and a first power module including: a first upper phase switch configured to control a first upper phase flow of current between the positive connection of the battery and a first phase connection of the motor, and a first lower phase switch configured to control a first lower phase flow of current between a negative connection of the battery and the first phase connection of the motor.

20 Claims, 10 Drawing Sheets

Related U.S. Application Data on Sep. 28, 2022, provisional application No. 63/377,501, filed on Sep. 28, 2022, provisional application No. 63/377,486, filed on Sep. 28, 2022.

(51) Int. Cl.

| | |
|---|---|
| *B60L 15/00* | (2006.01) |
| *B60L 15/08* | (2006.01) |
| *B60L 50/40* | (2019.01) |
| *B60L 50/51* | (2019.01) |
| *B60L 50/60* | (2019.01) |
| *B60L 50/64* | (2019.01) |
| *B60L 53/20* | (2019.01) |
| *B60L 53/22* | (2019.01) |
| *B60L 53/62* | (2019.01) |
| *B60R 16/02* | (2006.01) |
| *G01R 15/20* | (2006.01) |
| *G06F 1/08* | (2006.01) |
| *G06F 13/40* | (2006.01) |
| *H01L 21/48* | (2006.01) |
| *H01L 23/00* | (2006.01) |
| *H01L 23/15* | (2006.01) |
| *H01L 23/367* | (2006.01) |
| *H01L 23/373* | (2006.01) |
| *H01L 23/40* | (2006.01) |
| *H01L 23/467* | (2006.01) |
| *H01L 23/473* | (2006.01) |
| *H01L 23/495* | (2006.01) |
| *H01L 23/538* | (2006.01) |
| *H01L 25/00* | (2006.01) |
| *H01L 25/07* | (2006.01) |
| *H02J 7/00* | (2006.01) |
| *H02M 1/00* | (2007.01) |
| *H02M 1/08* | (2006.01) |
| *H02M 1/084* | (2006.01) |
| *H02M 1/088* | (2006.01) |
| *H02M 1/12* | (2006.01) |
| *H02M 1/32* | (2007.01) |
| *H02M 1/42* | (2007.01) |
| *H02M 1/44* | (2007.01) |
| *H02M 3/335* | (2006.01) |
| *H02M 7/00* | (2006.01) |
| *H02M 7/537* | (2006.01) |
| *H02M 7/5395* | (2006.01) |
| *H02P 27/06* | (2006.01) |
| *H02P 27/08* | (2006.01) |
| *H02P 29/024* | (2016.01) |
| *H02P 29/68* | (2016.01) |
| *H05K 1/14* | (2006.01) |
| *H05K 1/18* | (2006.01) |
| *H05K 5/02* | (2006.01) |
| *H05K 7/20* | (2006.01) |
| *H10D 64/01* | (2025.01) |
| *B60L 15/20* | (2006.01) |
| *H03K 19/20* | (2006.01) |

(52) U.S. Cl.
CPC ............. *B60L 50/40* (2019.02); *B60L 50/51* (2019.02); *B60L 50/60* (2019.02); *B60L 50/64* (2019.02); *B60L 53/20* (2019.02); *B60L 53/22* (2019.02); *B60L 53/62* (2019.02); *B60R 16/02* (2013.01); *G01R 15/20* (2013.01); *G06F 1/08* (2013.01); *G06F 13/4004* (2013.01); *H01L 21/4882* (2013.01); *H01L 23/15* (2013.01); *H01L 23/3672* (2013.01); *H01L 23/3675* (2013.01); *H01L 23/3735* (2013.01); *H01L 23/4006* (2013.01); *H01L 23/467* (2013.01); *H01L 23/473* (2013.01); *H01L 23/49562* (2013.01); *H01L 23/5383* (2013.01); *H01L 24/32* (2013.01); *H01L 24/33* (2013.01); *H01L 25/072* (2013.01); *H01L 25/50* (2013.01); *H02J 7/0063* (2013.01); *H02M 1/0009* (2021.05); *H02M 1/0054* (2021.05); *H02M 1/08* (2013.01); *H02M 1/084* (2013.01); *H02M 1/088* (2013.01); *H02M 1/123* (2021.05); *H02M 1/32* (2013.01); *H02M 1/322* (2021.05); *H02M 1/327* (2021.05); *H02M 1/4258* (2013.01); *H02M 1/44* (2013.01); *H02M 3/33523* (2013.01); *H02M 7/003* (2013.01); *H02M 7/537* (2013.01); *H02M 7/53871* (2013.01); *H02M 7/53875* (2013.01); *H02M 7/5395* (2013.01); *H02P 27/06* (2013.01); *H02P 27/08* (2013.01); *H02P 27/085* (2013.01); *H02P 29/024* (2013.01); *H02P 29/027* (2013.01); *H02P 29/68* (2016.02); *H05K 1/145* (2013.01); *H05K 1/181* (2013.01); *H05K 1/182* (2013.01); *H05K 5/0247* (2013.01); *H05K 7/20154* (2013.01); *H05K 7/2039* (2013.01); *H05K 7/2049* (2013.01); *H05K 7/20854* (2013.01); *H05K 7/209* (2013.01); *H05K 7/20927* (2013.01); *H10D 64/018* (2025.01); *B60L 15/20* (2013.01); *B60L 2210/30* (2013.01); *B60L 2210/40* (2013.01); *B60L 2210/42* (2013.01); *B60L 2210/44* (2013.01); *B60L 2240/36* (2013.01); *G06F 2213/40* (2013.01); *H01L 2023/405* (2013.01); *H01L 2023/4087* (2013.01); *H01L 2224/32225* (2013.01); *H01L 2224/32245* (2013.01); *H01L 2224/33181* (2013.01); *H02J 2207/20* (2020.01); *H02P 2207/05* (2013.01); *H03K 19/20* (2013.01); *H05K 2201/042* (2013.01); *H05K 2201/10166* (2013.01)

(58) Field of Classification Search
USPC ...................................................... 318/139
See application file for complete search history.

(56) References Cited

U.S. PATENT DOCUMENTS

| | | |
|---|---|---|
| 4,564,771 A | 1/1986 | Flohrs |
| 4,618,875 A | 10/1986 | Flohrs |
| 4,716,304 A | 12/1987 | Fiebig et al. |
| 5,068,703 A | 11/1991 | Conzelmann et al. |
| 5,432,371 A | 7/1995 | Denner et al. |
| 5,559,661 A | 9/1996 | Meinders |
| 5,654,863 A | 8/1997 | Davies |
| 5,764,007 A | 6/1998 | Jones |
| 5,841,312 A | 11/1998 | Mindl et al. |
| 6,028,470 A | 2/2000 | Michel et al. |
| 6,163,138 A | 12/2000 | Kohl et al. |
| 6,351,173 B1 | 2/2002 | Ovens et al. |
| 6,426,857 B1 | 7/2002 | Doster et al. |
| 6,597,556 B1 | 7/2003 | Michel et al. |
| 6,812,553 B2 | 11/2004 | Gerbsch et al. |
| 6,943,293 B1 | 9/2005 | Jeter et al. |
| 7,095,098 B2 | 8/2006 | Gerbsch et al. |
| 7,229,855 B2 | 6/2007 | Murphy |
| 7,295,433 B2 | 11/2007 | Taylor et al. |
| 7,459,954 B2 | 12/2008 | Kuehner et al. |
| 7,538,425 B2 | 5/2009 | Myers et al. |
| 7,551,439 B2 | 6/2009 | Peugh et al. |
| 7,616,047 B2 | 11/2009 | Rees et al. |
| 7,724,046 B2 | 5/2010 | Wendt et al. |
| 7,750,720 B2 | 7/2010 | Dittrich |

(56) References Cited

U.S. PATENT DOCUMENTS

| | | |
|---|---|---|
| 9,088,159 B2 | 7/2015 | Peuser |
| 9,275,915 B2 | 3/2016 | Heinisch et al. |
| 9,373,970 B2 | 6/2016 | Feuerstack et al. |
| 9,431,932 B2 | 8/2016 | Schmidt et al. |
| 9,509,281 B1* | 11/2016 | Francese ................ H04B 1/12 |
| 9,515,584 B2 | 12/2016 | Koller et al. |
| 9,548,675 B2 | 1/2017 | Schoenknecht |
| 9,806,607 B2 | 10/2017 | Ranmuthu et al. |
| 9,843,320 B2 | 12/2017 | Richter et al. |
| 9,871,444 B2 | 1/2018 | Ni et al. |
| 9,882,490 B2 | 1/2018 | Veeramreddi et al. |
| 10,111,285 B2 | 10/2018 | Shi et al. |
| 10,116,300 B2 | 10/2018 | Blasco et al. |
| 10,232,718 B2 | 3/2019 | Trunk et al. |
| 10,270,354 B1 | 4/2019 | Lu et al. |
| 10,291,225 B2 | 5/2019 | Li et al. |
| 10,525,847 B2 | 1/2020 | Strobel et al. |
| 10,797,579 B2 | 10/2020 | Hashim et al. |
| 10,924,001 B2 | 2/2021 | Li et al. |
| 11,082,052 B2 | 8/2021 | Jang et al. |
| 11,108,389 B2 | 8/2021 | Li et al. |
| 11,342,911 B2 | 5/2022 | Lee et al. |
| 11,838,011 B2 | 12/2023 | Li et al. |
| 11,843,320 B2 | 12/2023 | Sivakumar et al. |
| 11,848,426 B2 | 12/2023 | Zhang et al. |
| 11,851,038 B2 | 12/2023 | Solanki et al. |
| 11,855,522 B2 | 12/2023 | Rudolph et al. |
| 11,855,630 B2 | 12/2023 | Dake et al. |
| 11,870,338 B1 | 1/2024 | Narayanasamy |
| 11,872,997 B2 | 1/2024 | Hoos et al. |
| 11,881,859 B2 | 1/2024 | Gupta et al. |
| 11,888,391 B2 | 1/2024 | Balasubramanian et al. |
| 11,888,393 B2 | 1/2024 | Venkateswaran et al. |
| 11,901,803 B2 | 2/2024 | Ruck et al. |
| 11,901,881 B1 | 2/2024 | Narayanasamy |
| 11,909,319 B2 | 2/2024 | Esteghlal et al. |
| 11,916,426 B2 | 2/2024 | Oner et al. |
| 11,923,762 B2 | 3/2024 | Sethumadhavan et al. |
| 11,923,764 B1 | 3/2024 | Zhang |
| 11,923,799 B2 | 3/2024 | Ojha et al. |
| 11,925,119 B2 | 3/2024 | Male et al. |
| 11,927,624 B2 | 3/2024 | Patel et al. |
| 11,938,838 B2 | 3/2024 | Simonis et al. |
| 11,942,927 B2 | 3/2024 | Purcarea et al. |
| 11,942,934 B2 | 3/2024 | Ritter |
| 11,945,331 B2 | 4/2024 | Blemberg et al. |
| 11,945,522 B2 | 4/2024 | Matsumura et al. |
| 11,949,320 B2 | 4/2024 | Jaladanki et al. |
| 11,949,333 B2 | 4/2024 | Pahkala et al. |
| 11,955,896 B2 | 4/2024 | Liu et al. |
| 11,955,953 B2 | 4/2024 | Sinn et al. |
| 11,955,964 B2 | 4/2024 | Agarwal et al. |
| 11,962,234 B2 | 4/2024 | Narayanasamy et al. |
| 11,962,291 B2 | 4/2024 | Oberdieck et al. |
| 11,964,587 B2 | 4/2024 | Yukawa |
| 11,970,076 B2 | 4/2024 | Sarfert et al. |
| 11,977,404 B2 | 5/2024 | Chandrasekaran |
| 11,984,802 B2 | 5/2024 | Merkin et al. |
| 11,984,876 B2 | 5/2024 | Neidorff et al. |
| 11,990,776 B2 | 5/2024 | Dulle |
| 11,990,777 B2 | 5/2024 | Woll et al. |
| 11,996,686 B2 | 5/2024 | Chan et al. |
| 11,996,699 B2 | 5/2024 | Vasconcelos Araujo et al. |
| 11,996,714 B2 | 5/2024 | El Markhi et al. |
| 11,996,715 B2 | 5/2024 | Nandi et al. |
| 11,996,762 B2 | 5/2024 | Hembach et al. |
| 11,996,830 B2 | 5/2024 | Murthy et al. |
| 11,996,847 B1 | 5/2024 | Kazama et al. |
| 12,003,191 B2 | 6/2024 | Chaudhary et al. |
| 12,003,229 B2 | 6/2024 | Kaya et al. |
| 12,003,237 B2 | 6/2024 | Waters |
| 12,008,847 B2 | 6/2024 | Braun et al. |
| 12,009,679 B2 | 6/2024 | Gottwald et al. |
| 12,012,057 B2 | 6/2024 | Schneider et al. |
| 12,015,342 B2 | 6/2024 | Kienzler et al. |
| 12,019,112 B2 | 6/2024 | Jarmolowitz et al. |
| 12,021,517 B2 | 6/2024 | S et al. |
| 2009/0009980 A1* | 1/2009 | Ward .................. H02M 7/003 361/748 |
| 2010/0277958 A1* | 11/2010 | Campbell ............ B60K 6/485 363/40 |
| 2015/0311836 A1* | 10/2015 | Yoon ...................... H02P 6/14 318/400.26 |
| 2017/0331469 A1 | 11/2017 | Kilb et al. |
| 2018/0174946 A1* | 6/2018 | Bayerer ............... H01L 25/072 |
| 2018/0254732 A1* | 9/2018 | Smolenaers ............ H02J 1/12 |
| 2020/0195121 A1 | 6/2020 | Keskar et al. |
| 2020/0343049 A1* | 10/2020 | Paital ...................... H01G 4/38 |
| 2021/0005711 A1 | 1/2021 | Martinez-Limia et al. |
| 2021/0100128 A1 | 4/2021 | Lyu et al. |
| 2022/0052610 A1 | 2/2022 | Plum |
| 2022/0294441 A1 | 9/2022 | Purcarea et al. |
| 2023/0010616 A1 | 1/2023 | Gschwantner et al. |
| 2023/0061922 A1 | 3/2023 | Ritter |
| 2023/0082076 A1 | 3/2023 | Strache et al. |
| 2023/0126070 A1 | 4/2023 | Oberdieck et al. |
| 2023/0179198 A1 | 6/2023 | Winkler |
| 2023/0231210 A1 | 7/2023 | Joos et al. |
| 2023/0231400 A1 | 7/2023 | Oberdieck et al. |
| 2023/0231496 A1 | 7/2023 | Syed et al. |
| 2023/0238808 A1 | 7/2023 | Swoboda et al. |
| 2023/0268826 A1 | 8/2023 | Yan et al. |
| 2023/0335509 A1 | 10/2023 | Poddar |
| 2023/0365086 A1 | 11/2023 | Schumacher et al. |
| 2023/0370062 A1 | 11/2023 | Wolf |
| 2023/0378022 A1 | 11/2023 | Kim et al. |
| 2023/0386963 A1 | 11/2023 | Kim et al. |
| 2023/0402930 A1 | 12/2023 | Corry et al. |
| 2023/0420968 A1 | 12/2023 | Oner et al. |
| 2023/0421049 A1 | 12/2023 | Neidorff |
| 2024/0006869 A1 | 1/2024 | Kim et al. |
| 2024/0006899 A1 | 1/2024 | Wernerus |
| 2024/0006993 A1 | 1/2024 | Barjati et al. |
| 2024/0022187 A1 | 1/2024 | Fassnacht |
| 2024/0022240 A1 | 1/2024 | Balaz |
| 2024/0022244 A1 | 1/2024 | S et al. |
| 2024/0030730 A1 | 1/2024 | Wernerus |
| 2024/0039062 A1 | 2/2024 | Wernerus |
| 2024/0039402 A1 | 2/2024 | Bafna et al. |
| 2024/0039406 A1 | 2/2024 | Chen et al. |
| 2024/0048048 A1 | 2/2024 | Zhang |
| 2024/0055488 A1 | 2/2024 | Lee et al. |
| 2024/0067116 A1 | 2/2024 | Qiu |
| 2024/0072675 A1 | 2/2024 | Formenti et al. |
| 2024/0072817 A1 | 2/2024 | K et al. |
| 2024/0077899 A1 | 3/2024 | Chitnis et al. |
| 2024/0078204 A1 | 3/2024 | Roehrle et al. |
| 2024/0079950 A1 | 3/2024 | Narayanasamy |
| 2024/0079958 A1 | 3/2024 | Kumar et al. |
| 2024/0080028 A1 | 3/2024 | Dake et al. |
| 2024/0088647 A1 | 3/2024 | Ramadass et al. |
| 2024/0088896 A1 | 3/2024 | Bilhan et al. |
| 2024/0097437 A1 | 3/2024 | Goyal et al. |
| 2024/0097459 A1 | 3/2024 | Swoboda et al. |
| 2024/0105276 A1 | 3/2024 | Duryea |
| 2024/0106248 A1 | 3/2024 | Woll et al. |
| 2024/0106435 A1 | 3/2024 | Zhang et al. |
| 2024/0113517 A1 | 4/2024 | Sriraj et al. |
| 2024/0113611 A1 | 4/2024 | Kaufmann et al. |
| 2024/0113620 A1 | 4/2024 | Ranmuthu et al. |
| 2024/0113624 A1 | 4/2024 | Southard et al. |
| 2024/0120558 A1 | 4/2024 | Zhang et al. |
| 2024/0120765 A1 | 4/2024 | Oner et al. |
| 2024/0120962 A1 | 4/2024 | Miriyala et al. |
| 2024/0128851 A1 | 4/2024 | Ruck et al. |
| 2024/0128859 A1 | 4/2024 | Chen |
| 2024/0128867 A1 | 4/2024 | Wang et al. |
| 2024/0146177 A1 | 5/2024 | Mehdi et al. |
| 2024/0146306 A1 | 5/2024 | Ramkaj et al. |
| 2024/0149734 A1 | 5/2024 | Eisenlauer |
| 2024/0162723 A1 | 5/2024 | Zipf et al. |
| 2024/0178756 A1 | 5/2024 | El-Markhi et al. |
| 2024/0178824 A1 | 5/2024 | Kazama et al. |
| 2024/0186803 A1 | 6/2024 | Krieg et al. |

(56) References Cited

U.S. PATENT DOCUMENTS

| | | | |
|---|---|---|---|
| 2024/0198937 A1 | 6/2024 | Benqassmi et al. |
| 2024/0198938 A1 | 6/2024 | Carlos et al. |
| 2024/0204540 A1 | 6/2024 | Majmunovic et al. |
| 2024/0204541 A1 | 6/2024 | Majmunovic et al. |
| 2024/0204671 A1 | 6/2024 | Liu et al. |
| 2024/0204765 A1 | 6/2024 | Dake |
| 2024/0213874 A1 | 6/2024 | Junnarkar et al. |
| 2024/0213971 A1 | 6/2024 | Lee |
| 2024/0213975 A1 | 6/2024 | Narayanasamy |
| 2024/0213981 A1 | 6/2024 | Agarwal et al. |

FOREIGN PATENT DOCUMENTS

| | | | |
|---|---|---|---|
| WO | 2020156820 A1 | 8/2020 |
| WO | 2020239797 A1 | 12/2020 |
| WO | 2021110405 A1 | 6/2021 |
| WO | 2021213728 A1 | 10/2021 |
| WO | 2022012943 A1 | 1/2022 |
| WO | 2022229149 A1 | 11/2022 |
| WO | 2023006491 A1 | 2/2023 |
| WO | 2023046607 A1 | 3/2023 |
| WO | 2023094053 A1 | 6/2023 |
| WO | 2023110991 A1 | 6/2023 |
| WO | 2023147907 A1 | 8/2023 |
| WO | 2023151850 A1 | 8/2023 |
| WO | 2023227278 A1 | 11/2023 |
| WO | 2023237248 A1 | 12/2023 |
| WO | 2024006181 A2 | 1/2024 |
| WO | 2024012743 A1 | 1/2024 |
| WO | 2024012744 A1 | 1/2024 |
| WO | 2024022219 A1 | 2/2024 |
| WO | 2024041776 A1 | 2/2024 |
| WO | 2024046614 A1 | 3/2024 |
| WO | 2024049730 A1 | 3/2024 |
| WO | 2024049884 A1 | 3/2024 |
| WO | 2024049909 A1 | 3/2024 |
| WO | 2024056388 A1 | 3/2024 |
| WO | 2024068065 A1 | 4/2024 |
| WO | 2024068076 A1 | 4/2024 |
| WO | 2024068113 A1 | 4/2024 |
| WO | 2024068115 A1 | 4/2024 |
| WO | 2024083391 A1 | 4/2024 |
| WO | 2024093384 A1 | 5/2024 |
| WO | 2024104970 A1 | 5/2024 |
| WO | 2024108401 A1 | 5/2024 |
| WO | 2024110106 A1 | 5/2024 |
| WO | 2024110265 A1 | 5/2024 |
| WO | 2024110297 A1 | 5/2024 |
| WO | 2024114978 A1 | 6/2024 |
| WO | 2024114979 A1 | 6/2024 |
| WO | 2024114980 A1 | 6/2024 |
| WO | 2024128286 A1 | 6/2024 |
| WO | 2024132249 A1 | 6/2024 |

OTHER PUBLICATIONS

"New products," 5 Pages, Retrieved from internet URL:https://www.ti.com/product-category/new-products.html?%20releasePeriod=364#releasePeriod=90.

"Qualcomm and Bosch Showcase New Central Vehicle Computer for Digital Cockpit and Driver Assistance Functions at CES 2024," 2024, 8 Pages. Retrieved from internet URL:https://www.qualcomm.com/news/releases/2024/01/qualcomm-and-bosch-showcase-new-central-vehicle-computer-for-dig.

Balogh, L., "Fundamentals of MOSFET and IGBT Gate Driver Circuits," Texas Instruments Application Report, SLUA618-March (2017), Retrieved from internet URL: https://ghioni.faculty.polimi.it/pel/readmat/gate-drive.pdf, 65 pages.

Baranwal, S., "Common-mode transient immunity for isolated gate drivers," Analog Applications Journal, Texas Instruments (2015), Retrieved from internet URL: https://www.ti.com/lit/an/slyt648/slyt648.pdf?ts=1702052336068&ref_url=https%253A%252F%252Fwww.google.com%252F, 07 pages.

Boomer, K. and Ahmad H., "Performance Evaluation of an Automotive-Grade, High-Speed Gate Driver for SiC FETs, Type UCC27531, Over a Wide Temperature Range," NASA Electronic Parts and Packaging Program No. GRC-E-DAA-TN25898 (2015), Retrieved from Internet URL: https://ntrs.nasa.gov/api/citations/20150023034/downloads/20150023034.pdf, 08 pages.

Ke, X, et al., "A 3-to-40V 10-to-30MHz Automotive-Use GaN Driver with Active BST Balancing and VSW Dual-Edge Dead-Time Modulation Achieving 8.3% Efficiency Improvement and 3.4ns Constant Propagation Delay," 2016 IEEE International Solid-State Circuits Conference (ISSCC), IEEE, 2016, Retrieved from internet URL: https://picture.iczhiku.com/resource/IEEE/WYkrsJrSQPoSjNXm.pdf, 03 pages.

Sridhar, N., "Impact of an Isolated Gate Driver," Texas Instruments: Dallas, Texas (2019), Retrieved from Internet URL: https://www.ti.com/lit/wp/slyy140a/slyy140a.pdf, 08 pages.

Sridhar, N., "Power Electronics in Motor Drives: Where is it?" Texas Instruments (2015), Retrieved from Internet URL: https://www.ti.com/lit/wp/slyy078a/slyy078a.pdf, 09 pages.

Sridhar, N., "Silicon Carbide Gate Drivers—a Disruptive Technology in Power Electronics," Texas Instruments, Dallas, Texas (2019), Retrieved from Internet URL: https://www.ti.com/lit/wp/slyy139/slyy139.pdf, 07 pages.

Guo Suxuan et al: "3.38 Mhz operation of 1.2kV SiC MOSFET with integrated ultra-fast gate drive", 2015 IEEE 3rd Workshop on Wide Bandgap Power Devices and Applications (WIPDA), IEEE, Nov. 2, 2015, pp. 390-395, XP032839600.

Huang Zhizhao et al: "A High-Performance Embedded SiC Power Module Based on a DBC-Stacked Hybrid Packaging Structure", IEEE Journal of Emerging and Selected Topics in Power Electronics, IEEE, Piscataway, NJ, USA, vol. 8, No. 1, Sep. 25, 2019, pp. 351-366, XP011769559.

Miyazaki Tatsuya et al: "Semi-Theoretical Prediction of Turn-off Surge Voltage in a SiC MOSFET Power Module with an Embedded DC-link Decoupling Capacitor", 2020 IEEE Applied Power Electronics Conference and Exposition (APEC), IEEE, Mar. 15, 2020, pp. 2806-2809, XP033784633.

Park Yongwan et al: "Characterization of a Bare-Die SiC-Based, Wirebond-Less, Integrated Half-Bridge With Multi-Functional Bus-Bars", IEEE Transactions on Transportation Electrification, IEEE, vol. 8, No. 3, Mar. 1, 2022, pp. 3946-3959, XP011915774.

Yang L. et al: "Electrical Performance and Reliability Characterization of a SiC MOSFET Power Module with Embedded Decoupling Capacitors", IEEE Transactions on Power Electronics,, vol. 33, No. 12, Dec. 1, 2018, pp. 10594-10601, XP002810571.

* cited by examiner

SYSTEMS AND METHODS FOR DECOUPLING CAPACITOR FOR INVERTER FOR ELECTRIC VEHICLE

CROSS-REFERENCE TO RELATED APPLICATION(S)

This application claims the benefit of priority to U.S. Provisional Patent Application No. 63/377,486, filed Sep. 28, 2022, U.S. Provisional Patent Application No. 63/377,501, filed Sep. 28, 2022, U.S. Provisional Patent Application No. 63/377,512, filed Sep. 28, 2022, and U.S. Provisional Patent Application No. 63/378,601, filed Oct. 6, 2022, the entireties of which are incorporated by reference herein.

TECHNICAL FIELD

Various embodiments of the present disclosure relate generally to systems and methods for a decoupling capacitor for an inverter for an electric vehicle, and, more particularly, to systems and methods for a local high voltage decoupling capacitor for power device switches for an inverter for an electric vehicle.

BACKGROUND

Inverters, such as those used to drive a motor in an electric vehicle, for example, are responsible for converting High Voltage Direct Current (HVDC) into Alternating Current (AC) to drive the motor. In an inverter, stray inductances and ringing in a power device switches may affect an operation of the inverter.

The present disclosure is directed to overcoming one or more of these above-referenced challenges.

SUMMARY OF THE DISCLOSURE

In some aspects, the techniques described herein relate to a system including: an inverter configured to convert DC power from a battery to AC power to drive a motor, wherein the inverter includes: a first decoupling capacitor configured to be connected to a positive connection of the battery and a negative connection of the battery; and a first power module including: a first upper phase switch configured to control a first upper phase flow of current between the positive connection of the battery and a first phase connection of the motor, and a first lower phase switch configured to control a first lower phase flow of current between a negative connection of the battery and the first phase connection of the motor.

In some aspects, the techniques described herein relate to a system, wherein one or more of the first upper phase switch or the first lower phase switch includes one or more silicon carbide dies.

In some aspects, the techniques described herein relate to a system, wherein the first power module includes the first decoupling capacitor integrated on the first power module.

In some aspects, the techniques described herein relate to a system, wherein the first power module further includes: one or more first controllers configured to operate one or more of the first upper phase switch or the first lower phase switch.

In some aspects, the techniques described herein relate to a system, wherein the inverter further includes: a bulk capacitor configured to be connected to the positive connection of the battery and the negative connection of the battery.

In some aspects, the techniques described herein relate to a system, wherein the inverter further includes: a second decoupling capacitor configured to be connected to a positive connection of the battery and a negative connection of the battery; and a second power module including: a second upper phase switch configured to control a second upper phase flow of current between the positive connection of the battery and a second phase connection of the motor, and a second lower phase switch configured to control a second lower phase flow of current between the negative connection of the battery and the second phase connection of the motor.

In some aspects, the techniques described herein relate to a system, wherein the inverter further includes: a third decoupling capacitor configured to be connected to a positive connection of the battery and a negative connection of the battery; and a third power module including: a third upper phase switch configured to control a third upper phase flow of current between the positive connection of the battery and a third phase connection of the motor, and a third lower phase switch configured to control a third lower phase flow of current between the negative connection of the battery and the third phase connection of the motor.

In some aspects, the techniques described herein relate to a system, further including: the battery configured to supply the DC power to the inverter; and the motor configured to receive the AC power from the inverter to drive the motor.

In some aspects, the techniques described herein relate to a system including: an inverter configured to convert DC power from a battery to AC power to drive a motor, wherein the inverter includes: a bulk capacitor configured to be connected to a positive connection of the battery and a negative connection of the battery; a first phase power module configured to control a first flow of current between the positive connection of the battery, the negative connection of the battery, and a first phase connection of the motor; a first decoupling capacitor configured to be connected to the positive connection of the battery and the negative connection of the battery; a second phase power module configured to control a second flow of current between the positive connection of the battery, the negative connection of the battery, and a second phase connection of the motor; a second decoupling capacitor configured to be connected to the positive connection of the battery and the negative connection of the battery; a third phase power module configured to control a third flow of current between the positive connection of the battery, the negative connection of the battery, and a third phase connection of the motor; and a third decoupling capacitor configured to be connected to the positive connection of the battery and the negative connection of the battery.

In some aspects, the techniques described herein relate to a system, wherein the first phase power module includes the first decoupling capacitor on the first phase power module, wherein the second phase power module includes the second decoupling capacitor on the second phase power module, and wherein the third phase power module includes the third decoupling capacitor on the third phase power module.

In some aspects, the techniques described herein relate to a system, wherein the first power module includes one or more first phase switches, and one or more first phase controllers configured to operate the one or more first phase switches, wherein the second power module includes one or more second phase switches, and one or more second phase controllers configured to operate the one or more second phase switches, and wherein the third power module includes one or more third phase switches, and one or more third phase controllers configured to operate the one or more third phase switches.

In some aspects, the techniques described herein relate to a system, wherein the one or more first phase switches includes one or more silicon carbide dies, wherein the one or more second phase switches includes one or more silicon carbide dies, and wherein the one or more third phase switches includes one or more silicon carbide dies.

In some aspects, the techniques described herein relate to a system, wherein the first decoupling capacitor, the second decoupling capacitor, and the third decoupling capacitor are configured to reduce a high-frequency ringing of a switching event of the first phase power module, the second phase power module, and the third phase power module, respectively, relative to an inverter without the first decoupling capacitor, the second decoupling capacitor, and the third decoupling capacitor.

In some aspects, the techniques described herein relate to a system, wherein the first decoupling capacitor, the second decoupling capacitor, and the third decoupling capacitor are configured to reduce switching losses of the first phase power module, the second phase power module, and the third phase power module, respectively, relative to an inverter without the first decoupling capacitor, the second decoupling capacitor, and the third decoupling capacitor.

In some aspects, the techniques described herein relate to a system including: a power module for an inverter configured to be connected to a DC power source, the power module including: one or more power switches configured to control a flow of current between a first connection of the DC power source, a second connection of the DC power source, and an AC connection; and an integrated decoupling capacitor configured to be connected to the first connection of the DC power source and the second connection of the DC power source.

In some aspects, the techniques described herein relate to a system, wherein the one or more power switches includes one or more silicon carbide dies.

In some aspects, the techniques described herein relate to a system, wherein the power module includes the integrated decoupling capacitor on the power module.

In some aspects, the techniques described herein relate to a system, wherein the power module includes the integrated decoupling capacitor connected to a DC first connection tab of the power module and a DC second connection tab of the power module.

In some aspects, the techniques described herein relate to a system, wherein the integrated decoupling capacitor is configured to reduce a high-frequency ringing of the one or more power switches relative to a power module without a decoupling capacitor.

In some aspects, the techniques described herein relate to a system, wherein the power module further includes: one or more first controllers configured to operate the one or more power switches.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION OF EMBODIMENTS

Figure 1:
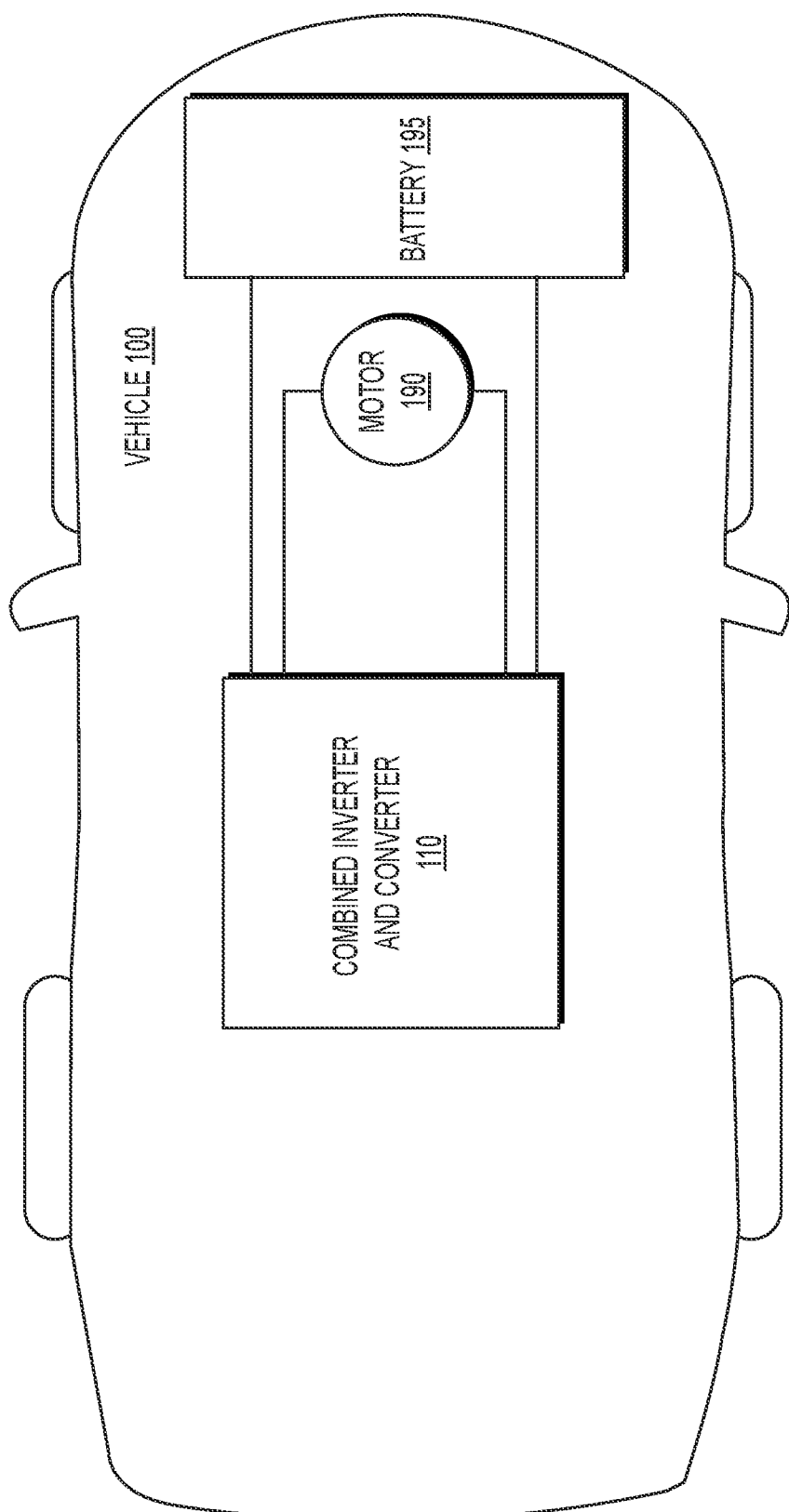
FIG. 1 depicts an exemplary system infrastructure for a vehicle including a combined inverter and converter, according to one or more embodiments.

Both the foregoing general description and the following detailed description are exemplary and explanatory only and are not restrictive of the features, as claimed. As used herein, the terms "comprises," "comprising," "has," "having," "includes," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, "about," "substantially," and "approximately" are used to indicate a possible variation of ±10% in the stated value. In this disclosure, unless stated otherwise, any numeric value may include a possible variation of ±10% in the stated value.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. For example, in the context of the disclosure, the switching devices may be described as switches or devices, but may refer to any device for controlling the flow of power in an electrical circuit. For example, switches may be metal-oxide-semiconductor field-effect transistors (MOSFETs), bipolar junction transistors (BJTs), insulated-gate bipolar transistors (IGBTs), or relays, for example, or any combination thereof, but are not limited thereto.

Various embodiments of the present disclosure relate generally to systems and methods for a decoupling capacitor for an inverter for an electric vehicle, and, more particularly, to systems and methods for a local high voltage decoupling capacitor for power device switches for an inverter for an electric vehicle.

INTRODUCTION

Inverters, such as those used to drive a motor in an electric vehicle, for example, are responsible for converting High Voltage Direct Current (HVDC) into Alternating Current (AC) to drive the motor. A three phase inverter may include a bridge with six power device switches (for example, power transistors such as IGBT or MOSFET) that are controlled by Pulse Width Modulation (PWM) signals generated by a controller. An inverter may include three phase switches to control the phase voltage, upper and lower gate drivers to control the switches, a PWM controller, and glue logic between the PWM controller and the gate drivers. The PWM controller may generate signals to define the intended states of the system. The gate drivers may send the signals from the PWM controller to the phase switches. The phase switches may drive the phase voltage. The inverter may include an isolation barrier between low voltage and high voltage planes. Signals may pass from the PWM controller to the phase switches by passing across the isolation barrier, which may employ optical, transformer-based, or capacitance-based isolation. PWM signals may be distorted when passing through the glue logic, which may include resistive, capacitive, or other types of filtering. PWM signals may be distorted when passing through the gate driver, due to the galvanic isolation barrier and other delays within the gate driver. PWM signals may be distorted when the signals processed by the phase switch via the gate driver output.

Gate drivers may tolerate common-mode transients that occur during field-effect transistor (FET) switching and when one side of the floating high voltage terminal is shorted to ground or subject to an electro-static discharge. These voltage transients may result in fast edges, which may create bursts of common-mode current through the galvanic isolation. A gate driver may need to demonstrate common-mode transient immunity (CMTI) in order to be effective and safe.

Gate drivers may have a high-voltage domain in common to the voltage plane of an associated FET. Further, high-voltage planes may be supplied by a flyback converter that may be isolated through a transformer from the low-voltage plane. The high-voltage domain supply may be used to power circuits which source and sink gate current to drive the FET and which may detect FET faults so the faults can be acted upon and/or communicated to the low-voltage domain. Gate drivers may include a galvanic channel dedicated to FET commands, and one or more bidirectional or unidirectional galvanic channels dedicated to FET communications.

High current switching transients may create strong electro-magnetic (EM) fields that may couple into nearby metal traces. The magnitude and frequency of coupled currents may depend upon the layout of the FET packaging solution and the direction and length of metal traces between the FET and the control integrated circuit (IC). For example, typical values for coupled currents may be up to 1 A at AC frequencies up to 100 MHz. Typically, within a circuit, the gate driver IC may be placed far enough away from the FET that high EM fields do not couple directly into the internal metal traces within the gate driver IC. The gate driver is placed a distance from EM fields such that induced currents within the circuitry are below levels that will cause malfunction of the gate driver, or a metal shield is placed between the gate driver and the source of EM fields to protect the gate driver circuitry. The output terminals of the gate driver that connect to the FET are exposed to the EM fields at the point where the output terminals are no longer covered by a shield. The gate driver switches large currents (such as 5A to 15A, for example) through these exposed terminals. The switched large currents are generally greater in magnitude than the EM-induced currents. The gate driver is able to overdrive the induced currents to maintain control of the FETs. The high side of the gate drivers and the FET may share a common ground and a gate control signal trace, both of which may be susceptible to coupled currents.

Gate drivers may turn on low-resistance switches to source and sink gate currents. Series resistors may sometimes be added to limit gate current. Switched gate currents may be larger than coupled currents in order to maintain control of their respective FETs.

Gate drivers may be able to sense FET operating voltages or currents in order to provide feedback and react to faults. Over-current faults may typically be detected by sensing the FET drain to source voltage and comparing the sensed voltage to a reference value. Sensed voltages may be heavily filtered to reject coupled currents. Filtering may slow down the response to fault conditions, resulting in delays in response. For example, the rate of current increase due to a low resistance short circuit may reach damaging levels prior to being detected by the heavily filtered drain to source voltage detection strategy. The resulting short circuit may damage the FET or the vehicle, prior to being detected and shut off.

According to one or more embodiments, a FET driver circuit may provide rapid over-current detection by either shunt current sensing or by diverting a fraction of the load current through a parallel FET that may have a current sensing circuit. Utilizing either strategy may require a "point-of-use IC" where sensing circuitry is in close proximity to the FET. Even if a point-of-use IC and a remote controller are resistant to EM fields, communication between the point-of-use IC and remote controller remains susceptible to induced currents. Point-of-use ICs have been implemented in low EM field applications, such as smart FETs for automotive applications. However, point-of-use ICs have not been used in high EM field applications. A high EM field may be a field (i) that induces a current within an IC that is in excess of an operating current of the IC and leads to malfunction, or (ii) that induces a differential voltage within an IC which is in excess of the operating differential voltage and leads to malfunction. A high EM field may be a field that is greater than approximately 10 A or approximately 100V, for example.

One or more embodiments may provide a reduction in switching power losses and EMI pollution caused by high frequency drain-source voltage ringing and drain current ringing. Switching power losses may be proportional to the magnitude of gate-drive current flowing into a gate terminal of a power device. Higher gate-drive current may result in a higher amplitude of drain-source voltage ringing and drain current ringing. Higher gate-drive current may result in higher power device switching losses. Lower power loop and bus bar stray inductances may result in faster power device switching time, so that a power device may be turned on and off in order to lower the switching power losses.

One or more embodiments may provide a method to reduce the negative effect of bus bar stray inductance with a safe switch response time, which may reduce switching time, which may reduce switching power losses. One or more embodiments may reduce high frequency ringing of a voltage and current of a terminal of a power device, which may enable faster switching, and may reduce switching power losses. One or more embodiments may lower the cost of a power device and associated system cooling. One or more embodiments may reduce an EMI pollution of a power device. One or more embodiments may reduce switching power losses. One or more embodiments may reduce EMI pollution due to noisy switching events of a power device. One or more embodiments may enable integration of a gate driver into the power device, which may increase reliability. One or more embodiments may reduce the size of a power module.

DISCUSSION OF FIGURES

FIG. 1 depicts an exemplary system infrastructure for a vehicle including a combined inverter and converter, according to one or more embodiments. In the context of this disclosure, the combined inverter and converter may be referred to as an inverter. As shown in FIG. 1, electric vehicle 100 may include an inverter 110, a motor 190, and a battery 195. The inverter 110 may include components to receive electrical power from an external source and output electrical power to charge battery 195 of electric vehicle 100. The inverter 110 may convert DC power from battery 195 in electric vehicle 100 to AC power, to drive motor 190 of the electric vehicle 100, for example, but the embodiments are not limited thereto. The inverter 110 may be bidirectional, and may convert DC power to AC power, or convert AC power to DC power, such as during regenerative braking, for example. Inverter 110 may be a three-phase inverter, a single-phase inverter, or a multi-phase inverter.

Figure 2:
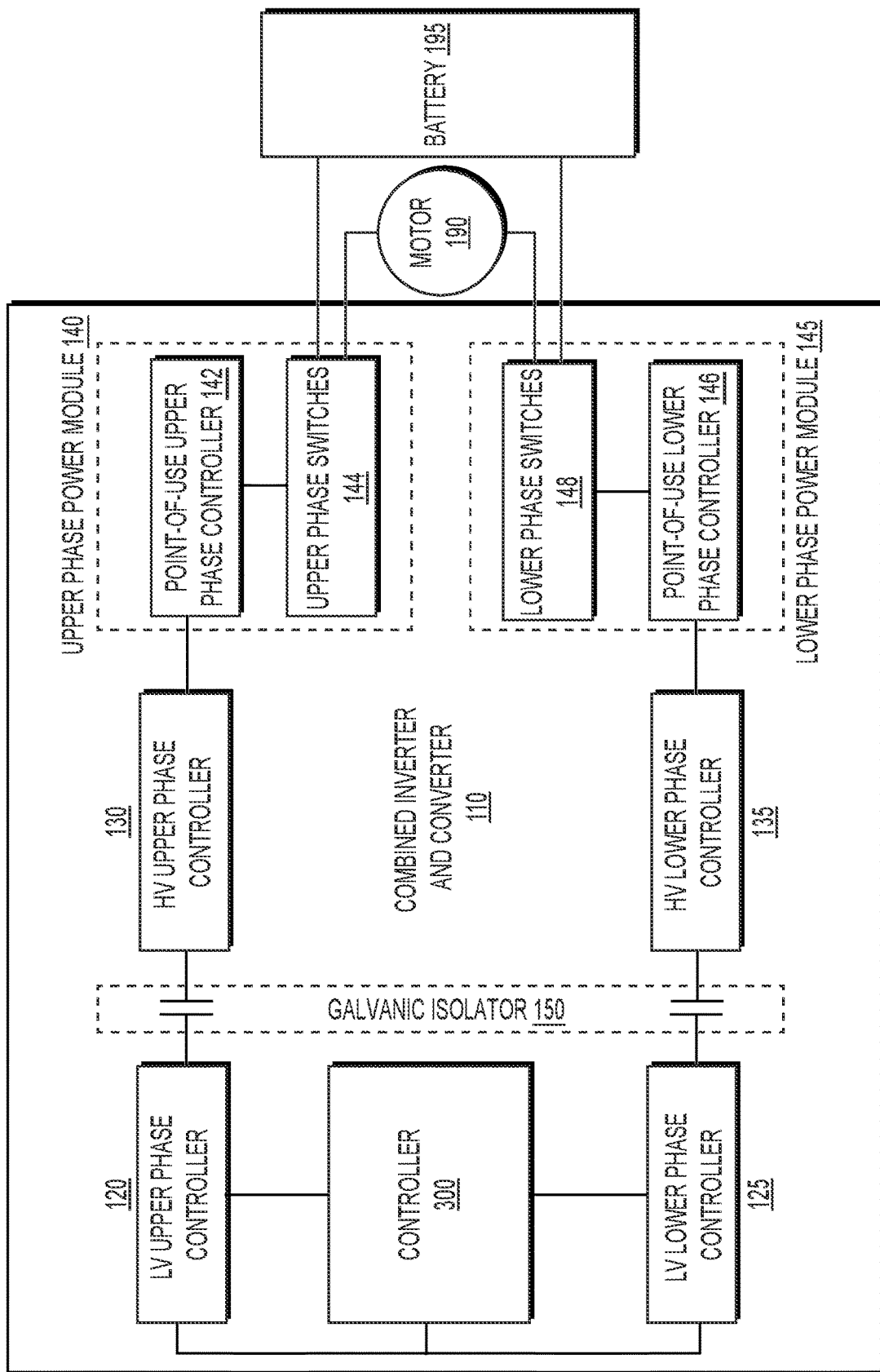
FIG. 2 depicts an exemplary system infrastructure for the combined inverter and converter of FIG. 1 with a point-of-use switch controller, according to one or more embodiments.

FIG. 2 depicts an exemplary system infrastructure for the inverter 110 of FIG. 1 with a point-of-use switch controller, according to one or more embodiments. Electric vehicle 100 may include inverter 110, motor 190, and battery 195. Inverter 110 may include an inverter controller 300 (shown in FIG. 3) to control the inverter 110. Inverter 110 may include a low voltage upper phase controller 120 separated from a high voltage upper phase controller 130 by a galvanic isolator 150, and an upper phase power module 140. Upper phase power module 140 may include a point-of-use upper phase controller 142 and upper phase switches 144. Inverter 110 may include a low voltage lower phase controller 125 separated from a high voltage lower phase controller 135 by galvanic isolator 150, and a lower phase power module 145. Lower phase power module 145 may include a point-of-use lower phase controller 146 and lower phase switches 148. Upper phase switches 144 and lower phase switches 148 may be connected to motor 190 and battery 195. Galvanic isolator 150 may be one or more of optical, transformer-based, or capacitance-based isolation. Galvanic isolator 150 may be one or more capacitors with a value from approximately 20 fF to approximately 100 fF, with a breakdown voltage from approximately 6 kV to approximately 12 kV, for example. Galvanic isolator 150 may include a pair of capacitors, where one capacitor of the pair carries a complementary, or 180-degree phase shifted, data signal from the other capacitor of the pair to create a differential signal for common-mode noise rejection. Galvanic isolator 150 may include more than one capacitor in series. Galvanic isolator 150 may include one capacitor located on a first IC, or may include a first capacitor located on a first IC and a second capacitor located on a second IC that communicates with the first IC.

Inverter 110 may include a low voltage area, where voltages are generally less than 5V, for example, and a high voltage area, where voltages may exceed 500V, for example. The low voltage area may be separated from the high voltage area by galvanic isolator 150. Inverter controller 300 may be in the low voltage area of inverter 110, and may send signals to and receive signals from low voltage upper phase controller 120. Low voltage upper phase controller 120 may be in the low voltage area of inverter 110, and may send signals to and receive signals from high voltage upper phase controller 130. Low voltage upper phase controller 120 may send signals to and receive signals from low voltage lower phase controller 125. High voltage upper phase controller 130 may be in the high voltage area of inverter 110. Accordingly, signals between low voltage upper phase controller 120 and high voltage upper phase controller 130 pass through galvanic isolator 150. High voltage upper phase controller 130 may send signals to and receive signals from point-of-use upper phase controller 142 in upper phase power module 140. Point-of-use upper phase controller 142 may send signals to and receive signals from upper phase switches 144. Upper phase switches 144 may be connected to motor 190 and battery 195. Upper phase switches 144 and lower phase switches 148 may be used to transfer energy from motor 190 to battery 195, from battery 195 to motor 190, from an external source to battery 195, or from battery 195 to an external source, for example. The lower phase system of inverter 110 may be similar to the upper phase system as described above.

Figure 3:
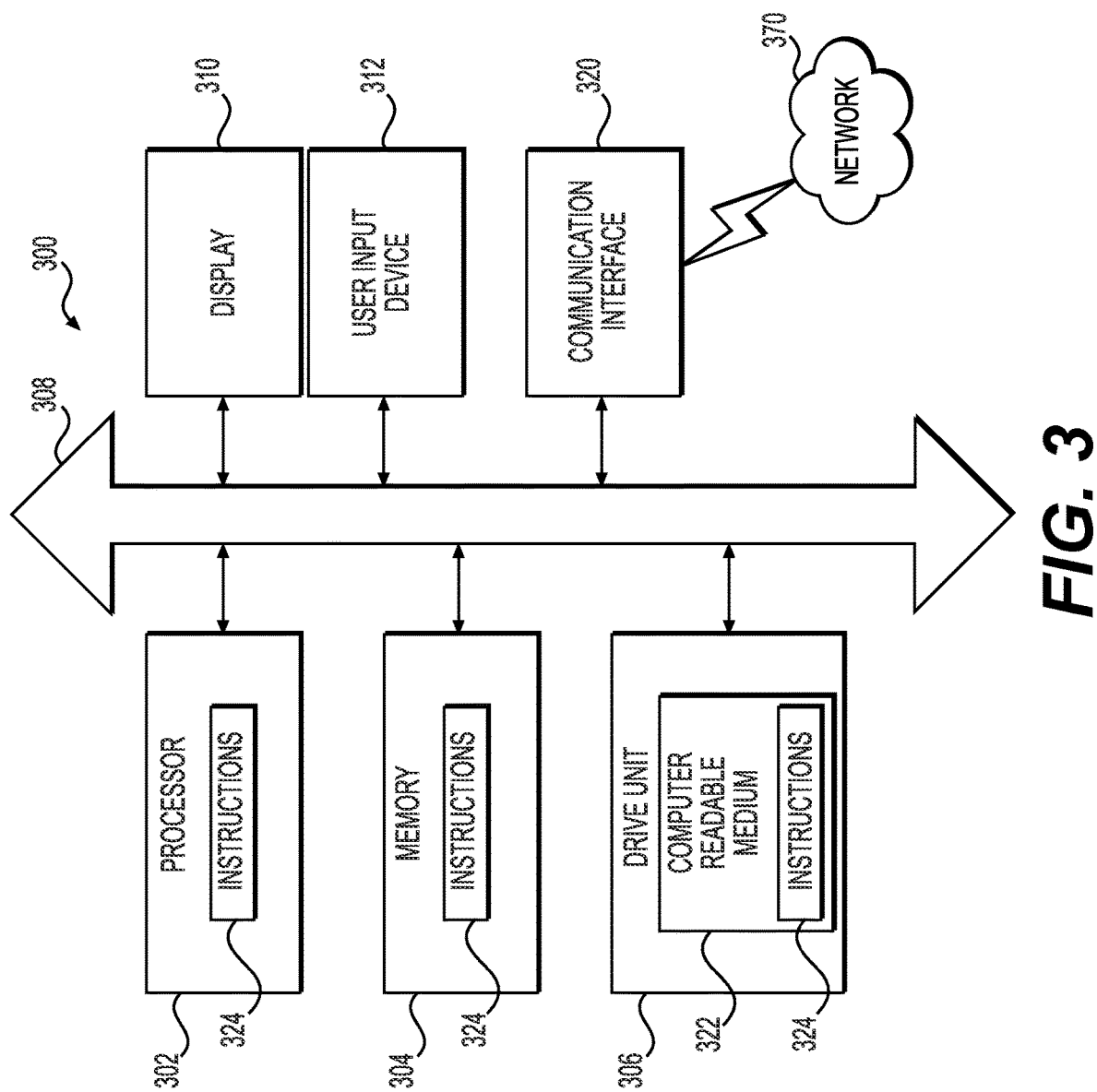
FIG. 3 depicts an exemplary system infrastructure for the controller of FIG. 2, according to one or more embodiments.

FIG. 3 depicts an exemplary system infrastructure for inverter controller 300 of FIG. 2, according to one or more embodiments. Inverter controller 300 may include one or more controllers.

The inverter controller 300 may include a set of instructions that can be executed to cause the inverter controller 300 to perform any one or more of the methods or computer based functions disclosed herein. The inverter controller 300 may operate as a standalone device or may be connected, e.g., using a network, to other computer systems or peripheral devices.

In a networked deployment, the inverter controller 300 may operate in the capacity of a server or as a client in a server-client user network environment, or as a peer computer system in a peer-to-peer (or distributed) network environment. The inverter controller 300 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular implementation, the inverter controller 300 can be implemented using electronic devices that provide voice, video, or data communication. Further, while the inverter controller 300 is illustrated as a single system, the term "system" shall also be taken to include any collection of systems or sub-systems that individually or jointly execute a set, or multiple sets, of instructions to perform one or more computer functions.

As shown in FIG. 3, the inverter controller 300 may include a processor 302, e.g., a central processing unit (CPU), a graphics processing unit (GPU), or both. The processor 302 may be a component in a variety of systems. For example, the processor 302 may be part of a standard inverter. The processor 302 may be one or more general processors, digital signal processors, application specific integrated circuits, field programmable gate arrays, servers, networks, digital circuits, analog circuits, combinations thereof, or other now known or later developed devices for analyzing and processing data. The processor 302 may implement a software program, such as code generated manually (i.e., programmed).

The inverter controller 300 may include a memory 304 that can communicate via a bus 308. The memory 304 may be a main memory, a static memory, or a dynamic memory. The memory 304 may include, but is not limited to computer readable storage media such as various types of volatile and non-volatile storage media, including but not limited to random access memory, read-only memory, programmable read-only memory, electrically erasable read-only memory, flash memory, magnetic tape or disk, optical media and the like. In one implementation, the memory 304 includes a cache or random-access memory for the processor 302. In alternative implementations, the memory 304 is separate from the processor 302, such as a cache memory of a processor, the system memory, or other memory. The memory 304 may be an external storage device or database for storing data. Examples include a hard drive, compact disc ("CD"), digital video disc ("DVD"), memory card, memory stick, floppy disc, universal serial bus ("USB") memory device, or any other device operative to store data. The memory 304 is operable to store instructions executable by the processor 302. The functions, acts or tasks illustrated in the figures or described herein may be performed by the processor 302 executing the instructions stored in the memory 304. The functions, acts or tasks are independent of the particular type of instructions set, storage media, processor or processing strategy and may be performed by software, hardware, integrated circuits, firm-ware, micro-code and the like, operating alone or in combination. Likewise, processing strategies may include multiprocessing, multitasking, parallel processing and the like.

As shown, the inverter controller 300 may further include a display 310, such as a liquid crystal display (LCD), an organic light emitting diode (OLED), a flat panel display, a solid-state display, a cathode ray tube (CRT), a projector, a printer or other now known or later developed display device for outputting determined information. The display 310 may act as an interface for the user to see the functioning of the processor 302, or specifically as an interface with the software stored in the memory 304 or in the drive unit 306.

Additionally or alternatively, the inverter controller 300 may include an input device 312 configured to allow a user to interact with any of the components of inverter controller 300. The input device 312 may be a number pad, a keyboard, or a cursor control device, such as a mouse, or a joystick, touch screen display, remote control, or any other device operative to interact with the inverter controller 300.

The inverter controller 300 may also or alternatively include drive unit 306 implemented as a disk or optical drive. The drive unit 306 may include a computer-readable medium 322 in which one or more sets of instructions 324, e.g. software, can be embedded. Further, the instructions 324 may embody one or more of the methods or logic as described herein. The instructions 324 may reside completely or partially within the memory 304 and/or within the processor 302 during execution by the inverter controller 300. The memory 304 and the processor 302 also may include computer-readable media as discussed above.

In some systems, a computer-readable medium 322 includes instructions 324 or receives and executes instructions 324 responsive to a propagated signal so that a device connected to a network 370 can communicate voice, video, audio, images, or any other data over the network 370. Further, the instructions 324 may be transmitted or received over the network 370 via a communication port or interface 320, and/or using a bus 308. The communication port or interface 320 may be a part of the processor 302 or may be a separate component. The communication port or interface 320 may be created in software or may be a physical connection in hardware. The communication port or interface 320 may be configured to connect with a network 370, external media, the display 310, or any other components in inverter controller 300, or combinations thereof. The connection with the network 370 may be a physical connection, such as a wired Ethernet connection or may be established wirelessly as discussed below. Likewise, the additional connections with other components of the inverter controller 300 may be physical connections or may be established wirelessly. The network 370 may alternatively be directly connected to a bus 308.

While the computer-readable medium 322 is shown to be a single medium, the term "computer-readable medium" may include a single medium or multiple media, such as a centralized or distributed database, and/or associated caches and servers that store one or more sets of instructions. The term "computer-readable medium" may also include any medium that is capable of storing, encoding, or carrying a set of instructions for execution by a processor or that cause a computer system to perform any one or more of the methods or operations disclosed herein. The computer-readable medium 322 may be non-transitory, and may be tangible.

The computer-readable medium 322 can include a solid-state memory such as a memory card or other package that houses one or more non-volatile read-only memories. The computer-readable medium 322 can be a random-access memory or other volatile re-writable memory. Additionally or alternatively, the computer-readable medium 322 can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative implementation, dedicated hardware implementations, such as application specific integrated circuits, programmable logic arrays and other hardware devices, can be constructed to implement one or more of the methods described herein. Applications that may include the apparatus and systems of various implementations can broadly include a variety of electronic and computer systems. One or more implementations described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The inverter controller 300 may be connected to a network 370. The network 370 may define one or more networks including wired or wireless networks. The wireless network may be a cellular telephone network, an 802.11, 802.16, 802.20, or WiMAX network. Further, such networks may include a public network, such as the Internet, a private network, such as an intranet, or combinations thereof, and may utilize a variety of networking protocols now available or later developed including, but not limited to TCP/IP based networking protocols. The network 370 may include wide area networks (WAN), such as the Internet, local area networks (LAN), campus area networks, metropolitan area networks, a direct connection such as through a Universal Serial Bus (USB) port, or any other networks that may allow for data communication. The network 370 may be configured to couple one computing device to another computing device to enable communication of data between the devices. The network 370 may generally be enabled to employ any form of machine-readable media for communicating information from one device to another. The network 370 may include communication methods by which information may travel between computing devices. The network 370 may be divided into sub-networks. The sub-networks may allow access to all of the other components connected thereto or the sub-networks may restrict access between the components. The network 370 may be regarded as a public or private network connection and may include, for example, a virtual private network or an encryption or other security mechanism employed over the public Internet, or the like.

In accordance with various implementations of the present disclosure, the methods described herein may be implemented by software programs executable by a computer system. Further, in an exemplary, non-limited implementation, implementations can include distributed processing, component or object distributed processing, and parallel processing. Alternatively, virtual computer system processing can be constructed to implement one or more of the methods or functionality as described herein.

Although the present specification describes components and functions that may be implemented in particular implementations with reference to particular standards and protocols, the disclosure is not limited to such standards and protocols. For example, standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

It will be understood that the operations of methods discussed are performed in one embodiment by an appropriate processor (or processors) of a processing (i.e., computer) system executing instructions (computer-readable code) stored in storage. It will also be understood that the disclosure is not limited to any particular implementation or programming technique and that the disclosure may be implemented using any appropriate techniques for implementing the functionality described herein. The disclosure is not limited to any particular programming language or operating system.

Figure 4:
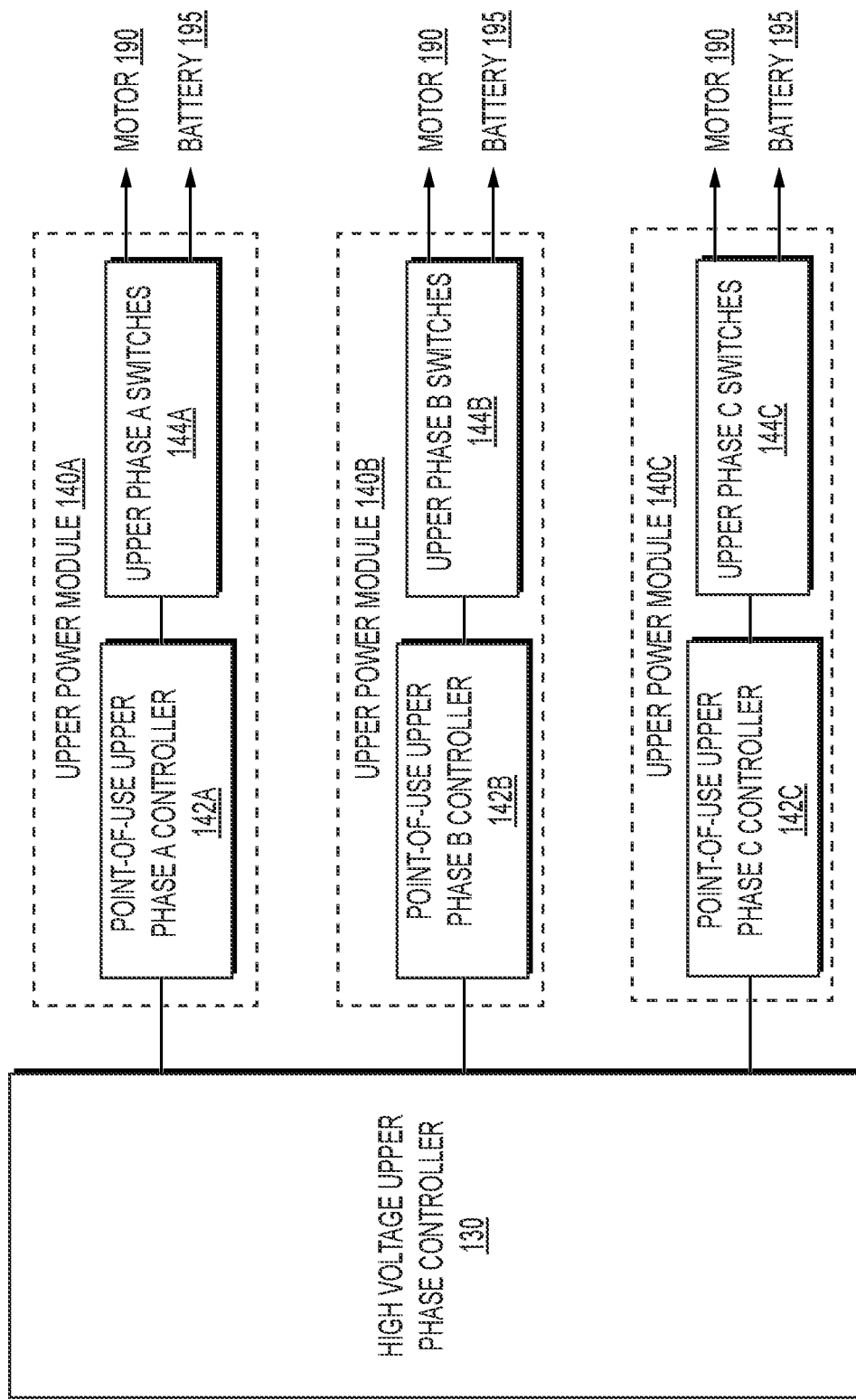
FIG. 4 depicts an exemplary system infrastructure for the point-of-use switch controller of FIG. 2, according to one or more embodiments.

FIG. 4 depicts an exemplary system infrastructure for the point-of-use switch controller of FIG. 2, according to one or more embodiments. For a three-phase inverter, each of the upper phase and the lower phase may include three phases correlating with phases A, B, and C. For example, upper phase power module 140 may include upper phase power module 140A for upper phase A, upper phase power module 140B for upper phase B, and upper phase power module 140C for upper phase C. Upper phase power module 140A may include point-of-use upper phase A controller 142A and upper phase A switches 144A. Upper phase power module 140B may include point-of-use upper phase B controller 142B and upper phase B switches 144B. Upper phase power module 140C may include point-of-use upper phase C controller 142C and upper phase C switches 144C. Each of the upper phase A switches 144A, upper phase B switches 144B, and upper phase C switches 144C may be connected to motor 190 and battery 195. FIG. 4 depicts details of the upper phase power module 140. Although not shown, the lower phase power module 145 may include a similar structure as the upper phase power module 140 for lower phases A, B, and C.

Figure 5:
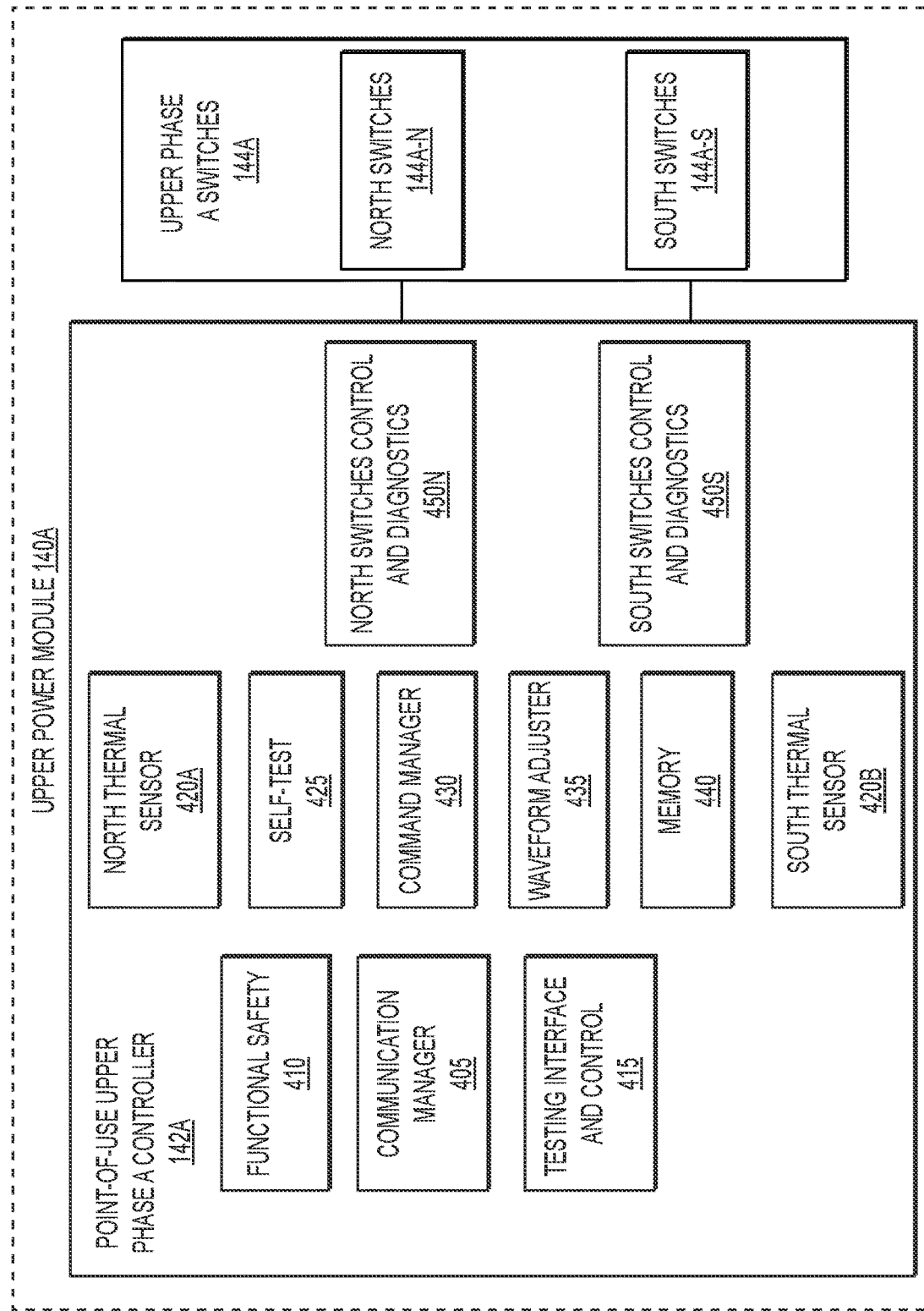
FIG. 5 depicts an exemplary system infrastructure for the upper power module of FIG. 4, according to one or more embodiments.

FIG. 5 depicts an exemplary system infrastructure for the upper power module of FIG. 4, according to one or more embodiments. For example, FIG. 5 provides additional details of upper phase power module 140A. Although not shown, upper phase power module 140B, upper phase power module 140C, and respective lower phase power modules of lower phase power module 145 may include a similar structure as the upper phase power module 140A shown in FIG. 5. Moreover, the terms upper, lower, north, and south used in the disclosure are merely for reference, do not limit the elements to a particular orientation, and are generally interchangeable throughout. For example, the upper phase power module 140 could be referred to a lower phase power module, a north phase power module, a south phase power module, a first phase power module, or a second phase power module.

Upper phase power module 140A may include point-of-use upper phase A controller 142A and upper phase A switches 144A. Upper phase A switches 144A may include one or more groups of switches. As shown in FIG. 5, upper phase A switches 144A may include upper phase A north switches 144A-N and upper phase A south switches 144A-S. Point-of-use upper phase A controller 142A may include one or more memories, controllers, or sensors. For example, point-of-use upper phase A controller 142A may include a communication manager 405, a functional safety controller 410, a testing interface and controller 415, a north thermal sensor 420A, a south thermal sensor 420B, a self-test controller 425, a command manager 430, a waveform adjuster 435, a memory 440, north switches control and diagnostics controller 450N, and south switches control and diagnostics controller 450S. Point-of-use upper phase A controller 142A may include more or less components than those shown in FIG. 5. For example, point-of-use upper phase A controller 142A may include more or less than two switch control and diagnostics controllers, and may include more than two thermal sensors.

Communication manager 405 may control inter-controller communications to and from point-of-use upper phase A controller 142A and/or may control intra-controller communications between components of point-of-use upper phase A controller 142A. Functional safety controller 410 may control safety functions of point-of-use upper phase A controller 142A. Testing interface and controller 415 may control testing functions of point-of-use upper phase A controller 142A, such as end-of-line testing in manufacturing, for example. North thermal sensor 420A may sense a temperature at a first location in point-of-use upper phase A controller 142A, and south thermal sensor 420B may sense a temperature at a second location in point-of-use upper phase A controller 142A. Self-test controller 425 may control a self-test function of point-of-use upper phase A controller 142A, such as during an initialization of the point-of-use upper phase A controller 142A following a power on event of inverter 110, for example. Command manager 430 may control commands received from communication manager 405 issued to the north switches control and diagnostics controller 450N and south switches control and diagnostics controller 450S. Waveform adjuster 435 may control a waveform timing and shape of commands received from communication manager 405 issued to the north switches control and diagnostics controller 450N and south switches control and diagnostics controller 450S. Memory 440 may include one or more volatile and non-volatile storage media for operation of point-of-use upper phase A controller 142A. North switches control and diagnostics controller 450N may send one or more signals to north switches 144A-N to control an operation of north switches 144A-N, and may receive one or more signals from north switches 144A-N that provide information about north switches 144A-N. South switches control and diagnostics controller 450S may send one or more signals to south switches 144A-S to control an operation of south switches 144A-S, and may receive one or more signals from south switches 144A-S that provide information about south switches 144A-S. As stated above, the terms north and south are merely used for reference, and north switches control and diagnostics controller 450N may send one or more signals to south switches 144A-S, and south switches control and diagnostics controller 450S may send one or more signals to south switches 144A-N.

Figure 6:
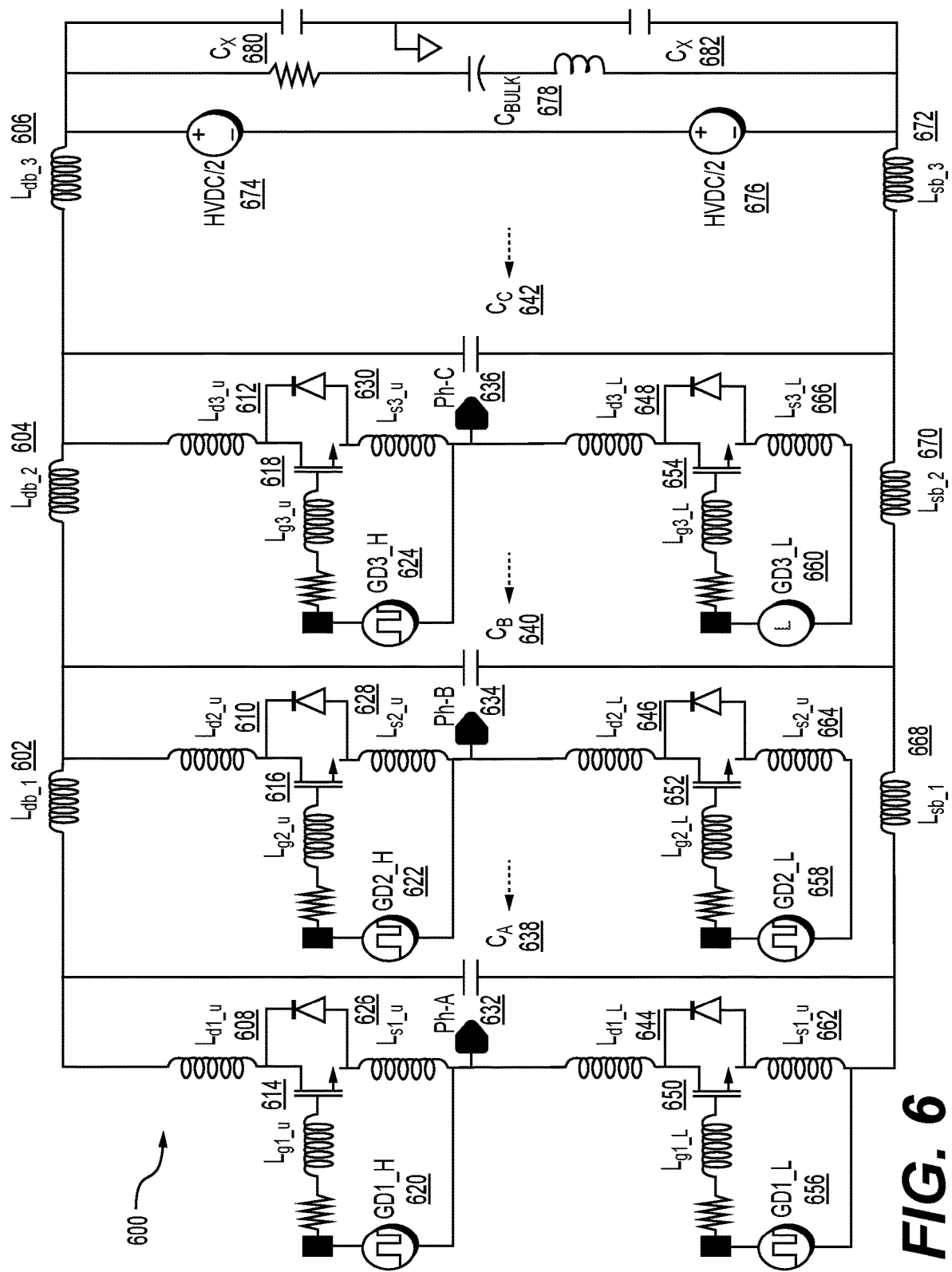
FIG. 6 depicts an exemplary electrical schematic for a system including a local high voltage decoupling capacitor for power device switches, according to one or more embodiments.

FIG. 6 depicts an exemplary electrical schematic for a system including a local high voltage decoupling capacitor for power device switches, according to one or more embodiments.

As shown in FIG. 6, phase driver system 600 may include a high voltage circuit for an inverter, such as inverter 110, for example. Phase driver system 600 may convert DC power from battery 674 and battery 676 to AC power to drive a motor, such as motor 190, for example. Battery 674 and battery 676 are represented as two power sources, but could be one or more power sources. For example, battery 674 and battery 676 may be an implementation of battery 195. For a three-phase motor, phase driver system 600 may provide three phase outputs as phase A connection 632 (Ph-A), phase B connection 634 (Ph-B), and phase C connection 636 (Ph-C). For each phase of the three-phase system, phase driver system 600 may include an upper "H" phase and a lower "L" phase. As shown in FIG. 6, phase driver system 600 may include decoupling capacitors phase A capacitor 638 (CA), phase B capacitor 640 (CB), and phase C capacitor 642 (Cc). Decoupling capacitor values may be at least one order of magnitude larger than the maximum output capacitance of the parallel power switches. The voltage rating of the decoupling capacitor may be the at least the value of the battery voltage amplitude. As shown in FIG. 6, phase driver system 600 may include various electrical components and characteristics.

For example, phase A connection 632 may include upper phase A gate driver 620 (GD1_H) for an upper phase A power switch, upper phase A gate inductance 614 (Lg1_U), upper phase A drain inductance 608 (Ld1_U), and upper phase A source inductance 626 (Ls1_U). These inductances may be unwanted stray characteristics of the system, such as from the electrical traces connecting the components of the inverter 110. These stray inductances are present in the system and may be reduced, along with their effects on a performance of the inverter 110. Phase A connection 632 may include lower phase A gate driver 656 (GD1_L) for a lower phase A power switch, lower phase A gate inductance 650 (Lg1_L), lower phase A drain inductance 644 (Ld1_L), and lower phase A source inductance 662 (Ls1_L). Phase A connection 632 may include phase A capacitor 638 (CA) electrically connected between a positive terminal of battery 674 and a negative terminal of battery 676. Phase A capacitor 638 (CA) may be electrically connected in parallel, as shown in FIG. 6, with the phase A connection 632 and associated components described above. Phase A connection 632 may include upper phase A series inductance 602 (Ldb_1) and lower phase A series inductance 668 (Lsb_1).

For example, phase B connection 634 may include upper phase B gate driver 622 (GD2_H) for an upper phase B power switch, upper phase B gate inductance 616 (Lg2_U), upper phase B drain inductance 610 (Ld2_U), and upper phase B source inductance 628 (Ls2_U). Phase B connection 634 may include lower phase B gate driver 658 (GD2_L) for a lower phase B power switch, lower phase B gate inductance 652 (Lg2_L), lower phase B drain inductance 646 (Ld2_L), and lower phase B source inductance 664 (Ls2_L). Phase B connection 634 may include phase B capacitor 640 (CB) electrically connected between a positive terminal of battery 674 and a negative terminal of battery 676. Phase B capacitor 640 (CB) may be electrically connected in parallel, as shown in FIG. 6, with the phase B connection 634 and associated components described above. Phase B connection 634 may include upper phase B series inductance 604 (Ldb_2) and lower phase B series inductance 670 (Lsb_2).

For example, phase C connection 636 may include upper phase C gate driver 624 (GD3_H) for an upper phase C power switch, upper phase C gate inductance 618 (Lg3_U), upper phase C drain inductance 612 (Ld3_U), and upper phase C source inductance 630 (Ls3_U). Phase C connection 636 may include lower phase C gate driver 660 (GD3_L) for a lower phase C power switch, lower phase C gate inductance 654 (Lg3_L), lower phase C drain inductance 648 (Ld3_L), and lower phase C source inductance 666 (Ls3_L). Phase C connection 636 may include phase C capacitor 642 (Cc) electrically connected between a positive terminal of battery 674 and a negative terminal of battery 676. Phase C capacitor 642 (Cc) may be electrically connected in parallel, as shown in FIG. 6, with the phase C connection 636 and associated components described above. Phase C connection 636 may include upper phase C series inductance 606 (Ldb_3) and lower phase C series inductance 672 (Lsb_3).

Phase A capacitor 638, phase B capacitor 640, and phase C capacitor 642 may be provided separately from respective power modules including phase power switches. The terminals of each of these capacitors may be connected as close as possible to the respective drain terminal of the upper phase power switch and the source terminal of the lower phase power switch in each respective phase. Phase A capacitor 638, phase B capacitor 640, and phase C capacitor 642 may be provided on, or integrated into, respective power modules including phase power switches. For example, phase A capacitor 638 may be integrated into a phase A power module with the upper phase A power switch and the lower phase A power switch. For example, phase A capacitor 638 may be electrically connected to a negative battery side tab of phase A power module and a positive battery side tab of phase A power module. The physical location of the phase A capacitor 638 may be provided to minimize the stray inductance between the terminals of the capacitors and the respective terminals of the power devices. One or more of upper phase A power switch or lower phase A power switch may include silicon carbide dies. Phase B and phase C components may be similar to phase A components.

Phase driver system 600 may include bulk capacitor 678, upper capacitance 680, and lower capacitance 682. There may be only one bulk capacitor 678 serving all three phases of the inverter 110, Bulk capacitor 678 may be configured to store and deliver energy. Bulk capacitor 678 may not exhibit an acceptable high frequency response. Bulk capacitor 678 may occupy more than half of a volume of the inverter 110, and may have a value of many hundred micro-Farads. An operation of the gate drivers and phase switches of phase driver system 600 may be similar to the operations described above for inverter 110.

Phase driver system 600 may have a resonant frequency (fr) according to the equation $fr=1/(2\pi\sqrt{\text{effective inductance} \times \text{effective capacitance}})$. For phase A connection 632, for example, the effective inductance may be equal to the sum of upper phase A drain inductance 608, upper phase A source inductance 626, lower phase A drain inductance 644, and lower phase A source inductance 662. For phase A connection 632, for example, the effective capacitance may be equal to the sum of an output capacitance of the upper and lower phase A switches (i.e. gate-to-drain capacitance+drain-to-source capacitance) and a capacitance of phase A capacitor 638. The output capacitance of the phase switches may be viewed as three highly nonlinear and voltage dependent intrinsic capacitors associated with each of upper and lower phase switches. The effective lump capacitance of the upper phase switch is in series with that of lower phase switch, and is connected in parallel with the decoupling capacitor. Based on the equation above, an example resonant frequency (fr) of phase A connection 632 may be approximately 2 MHz with only Vds ringing. For comparison, an example resonant frequency (fr) of an equivalent phase A connection 632 without phase A capacitor 638 may be approximately 25 MHz with both Vds ringing and Ids ringing.

Figure 7:
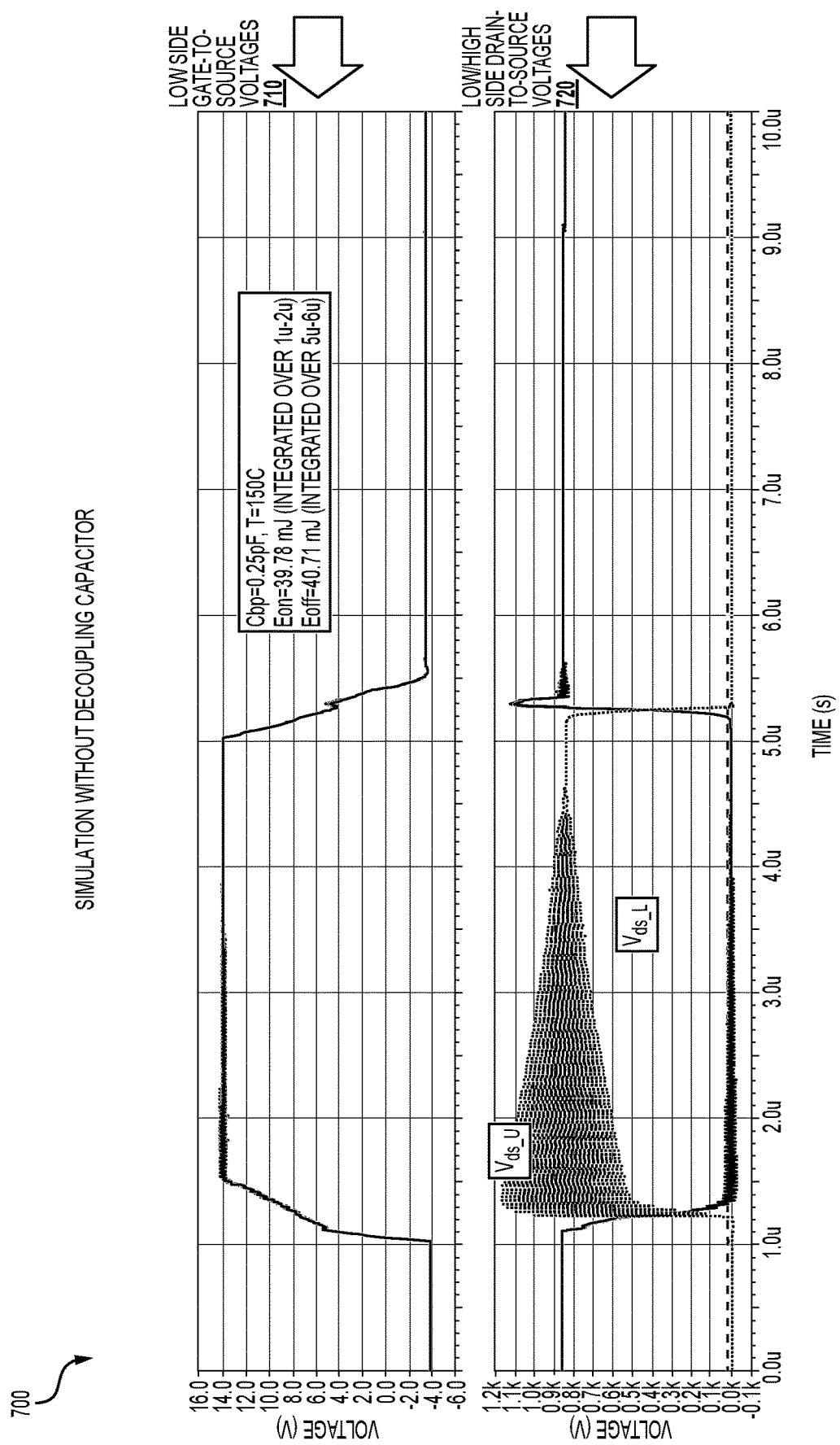
FIG. 7 depicts exemplary plots of a system without a local high voltage decoupling capacitor for power device switches, according to one or more embodiments.
Figure 7:
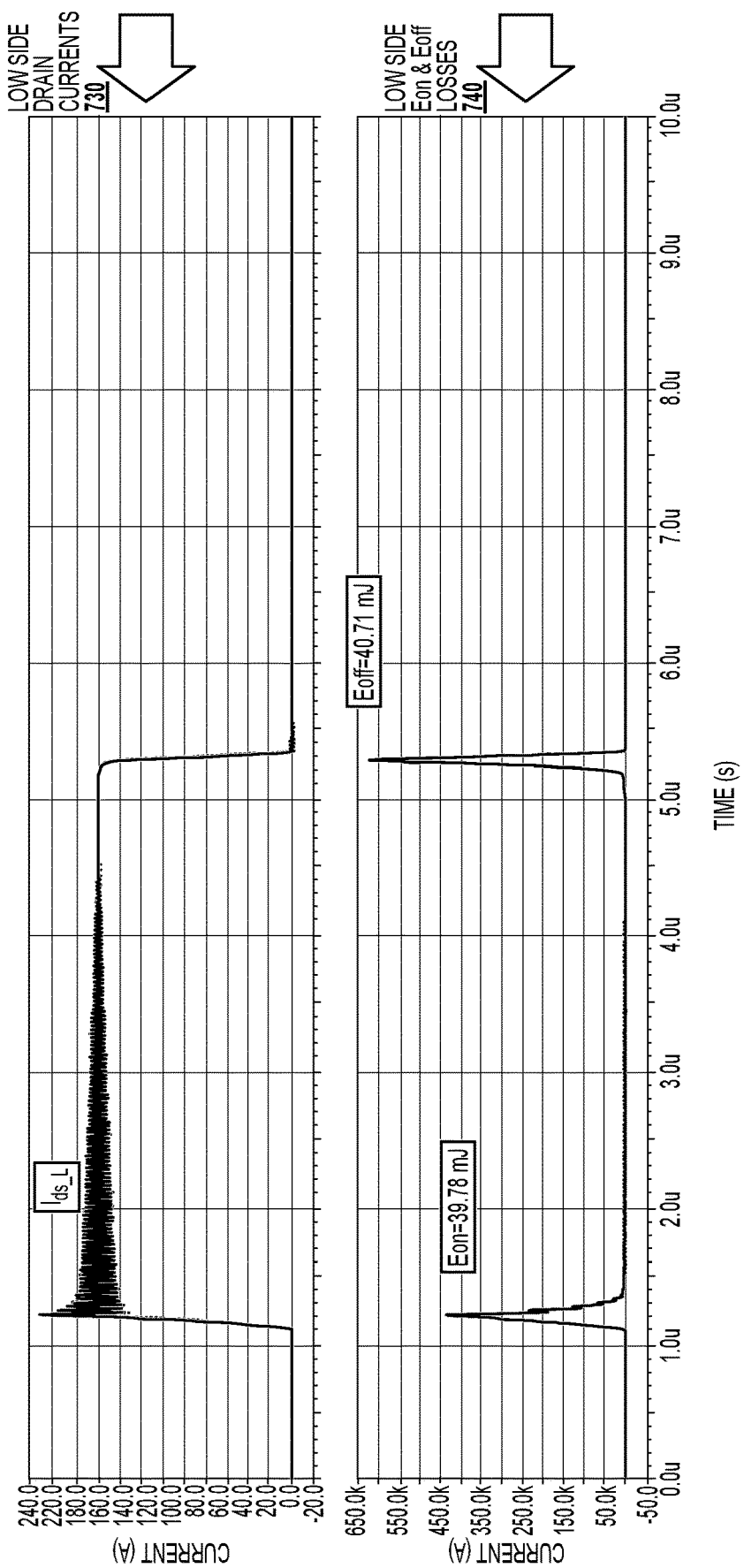

FIG. 7 depicts exemplary plots 700 of a system without a local high voltage decoupling capacitor for power device switches, according to one or more embodiments. As shown in VGS_L plot 710, a lower phase switch may switch on and off, as indicated by a gate-to-source-voltage increasing from a turn-off voltage of approximately −4V to a turn-on voltage of approximately 14V and decreasing back to a turn-off voltage of approximately −4V. As shown in VDS plot 720, this switching may cause high-frequency ringing of a drain-to-source voltage of both upper and lower phase switches, with a substantial ringing of the upper phase switch drain-to-source voltage (Vds_U). As shown in IDS_L plot 730, this switching may also cause substantial high-frequency ringing of a drain-to-source current Ids_L of the lower phase switch. As shown in plot 740, the lower phase switch may incur substantial switching losses (i.e. approximately 40 mJ) at both turn-on and turn-off events.

Figure 8:
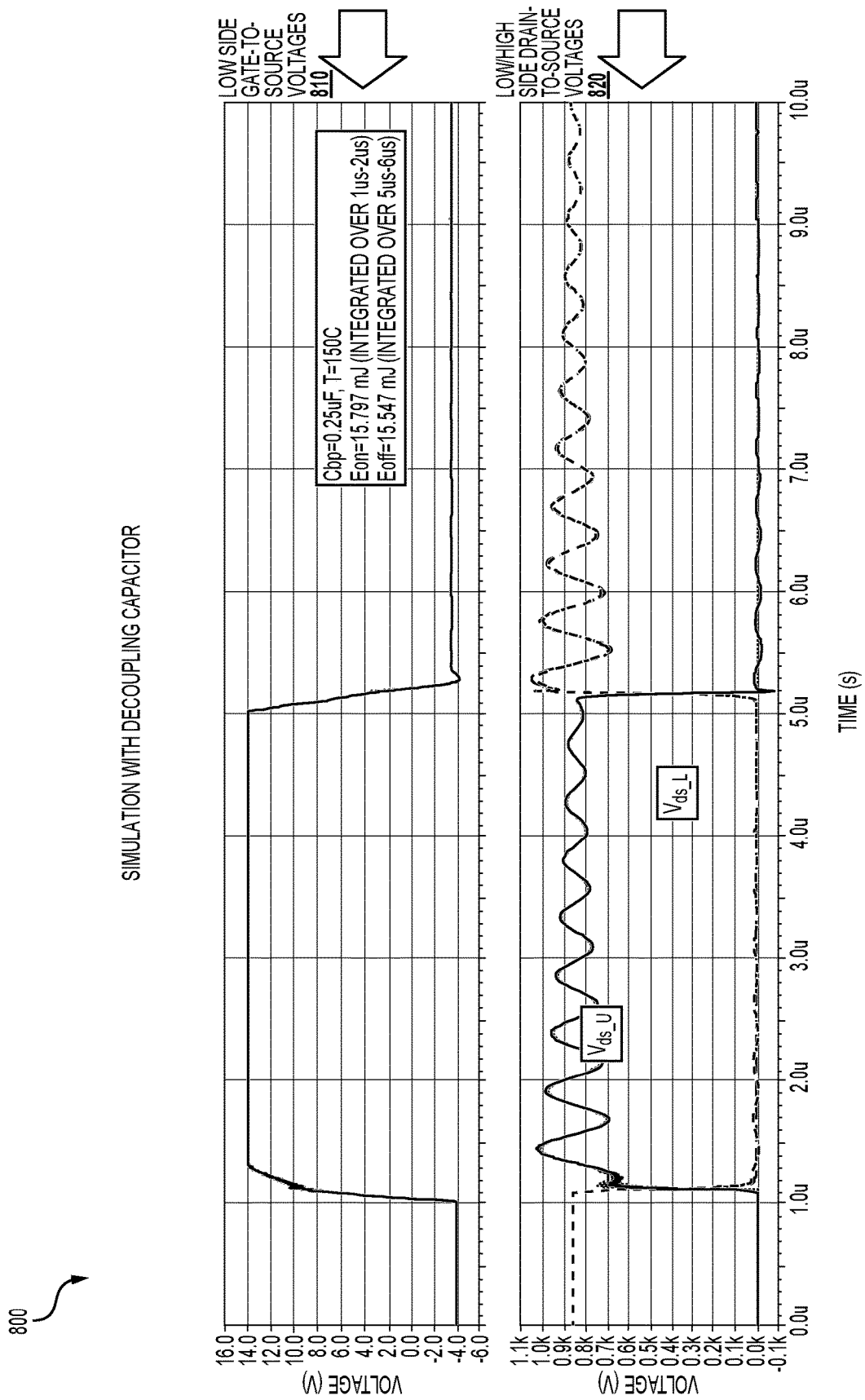
FIG. 8 depicts exemplary plots of a system with a local high voltage decoupling capacitor for power device switches, according to one or more embodiments.
Figure 8:
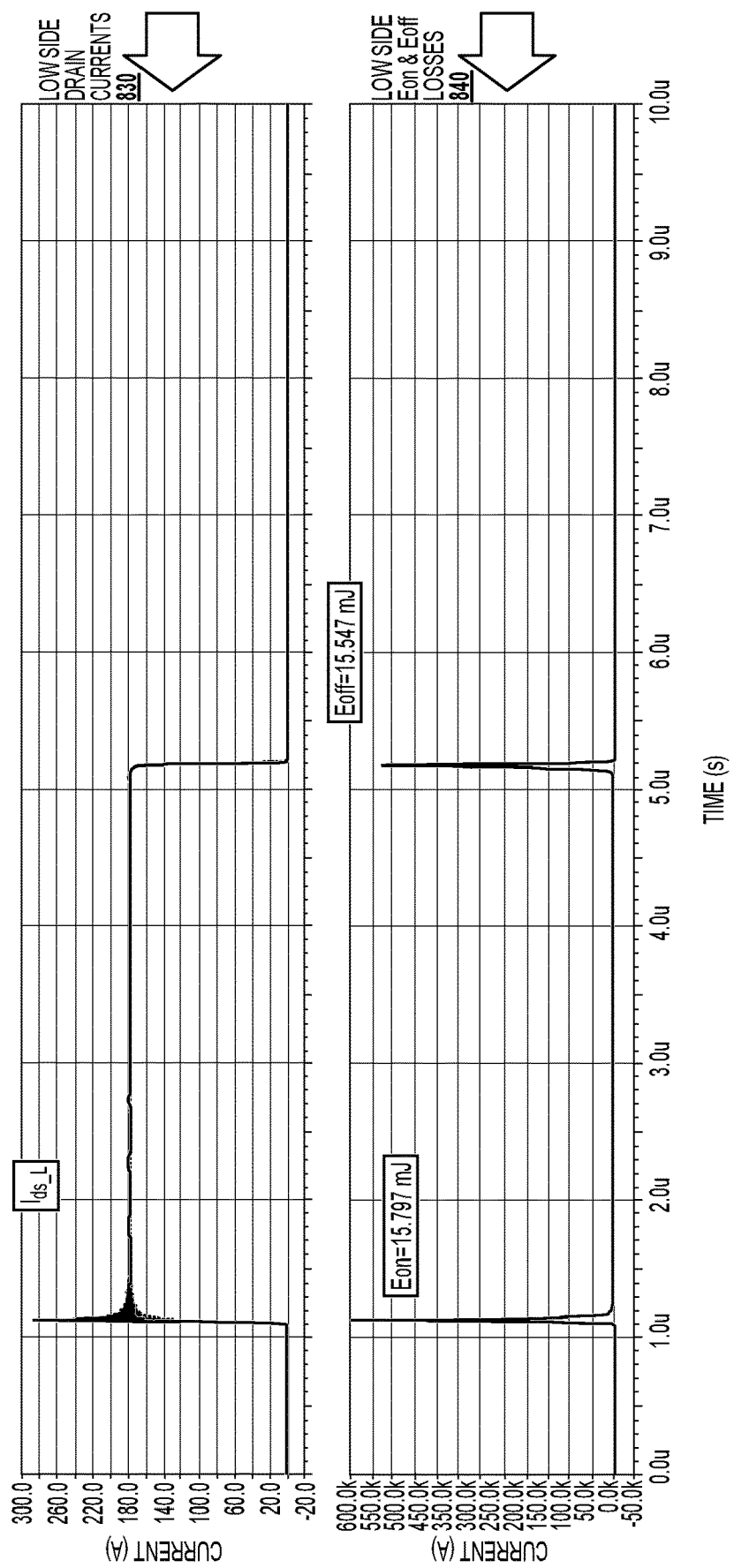

FIG. 8 depicts exemplary plots 800 of a system with a local high voltage decoupling capacitor for power device switches, according to one or more embodiments. As shown in VGS_L plot 810, a lower phase switch may switch on and off, as indicated by a gate-to-source-voltage increasing from a turn-off voltage of approximately −4V to a turn-on voltage of approximately 14V and decreasing back to a turn-off voltage of approximately −4V. As shown in VDS plot 820, this switching may cause much less ringing of a drain-to-source voltage of both upper and lower phase switches, compared to the ringing illustrated in VDS plot 720. As shown in IDS_L plot 830, this switching may also cause much less ringing of a drain-to-source current Ids_L of the lower phase switch. As shown in plot 840, the lower phase switch may incur lower switching losses (i.e. approximately 16 mJ compared to 40 mJ of plot 740) at both turn-on and turn-off events.

One or more embodiments may provide a reduction in switching power losses and EMI pollution caused by high frequency drain-source voltage ringing and drain current ringing. One or more embodiments may provide a method to reduce the negative effect of bus bar stray inductance with a safe switch response time, which may reduce switching time, which may reduce switching power losses. One or more embodiments may reduce high frequency ringing of a voltage and current of a terminal of a power device, which may enable faster switching, and may reduce switching power losses. One or more embodiments may lower the cost of a power device and associated system cooling. One or more embodiments may reduce an EMI pollution of a power device. One or more embodiments may reduce switching power losses. One or more embodiments may reduce EMI pollution due to noisy switching events of a power device. One or more embodiments may enable integration of a gate driver into the power device, which may increase reliability. One or more embodiments may reduce the size of a power module.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A system comprising:
   an inverter configured to convert DC power from a battery to AC power to drive a motor, wherein the inverter includes:
      a first decoupling capacitor configured to be connected to a positive connection of the battery and a negative connection of the battery; and
      a first power module including:
         one or more point-of-use controllers configured to operate in an electromagnetic field with a value greater than 10A or greater than 100V,
         a first upper phase switch configured to control a first upper phase flow of current between the positive connection of the battery and a first phase connection of the motor, and
         a first lower phase switch configured to control a first lower phase flow of current between the negative connection of the battery and the first phase connection of the motor,
         wherein terminals of the first decoupling capacitor are connected substantially adjacent to a drain terminal of the first upper phase switch and a source terminal of the first lower phase switch.

2. The system of claim 1, wherein one or more of the first upper phase switch or the first lower phase switch includes one or more silicon carbide dies.

3. The system of claim 1, wherein the first power module includes the first decoupling capacitor integrated on the first power module.

4. The system of claim 1, wherein the inverter further includes:
a bulk capacitor configured to be connected to the positive connection of the battery and the negative connection of the battery.

5. The system of claim 1, wherein the inverter further includes:
a second decoupling capacitor configured to be connected to the positive connection of the battery and the negative connection of the battery; and
a second power module including:
a second upper phase switch configured to control a second upper phase flow of current between the positive connection of the battery and a second phase connection of the motor, and
a second lower phase switch configured to control a second lower phase flow of current between the negative connection of the battery and the second phase connection of the motor.

6. The system of claim 5, wherein the inverter further includes:
a third decoupling capacitor configured to be connected to the positive connection of the battery and the negative connection of the battery; and
a third power module including:
a third upper phase switch configured to control a third upper phase flow of current between the positive connection of the battery and a third phase connection of the motor, and
a third lower phase switch configured to control a third lower phase flow of current between the negative connection of the battery and the third phase connection of the motor.

7. The system of claim 1, further comprising:
the battery configured to supply the DC power to the inverter; and
the motor configured to receive the AC power from the inverter to drive the motor.

8. The system of claim 1,
wherein terminals of the first decoupling capacitor are connected substantially adjacent to the drain terminal of the first upper phase switch and the source terminal of the first lower phase switch to reduce a stray inductance and a ringing between the terminals of the first decoupling capacitor and the drain terminal of the first upper phase switch and the source terminal of the first lower phase switch, and to reduce a switching loss in the first upper phase switch and the first lower phase switch.

9. A system comprising:
an inverter configured to convert DC power from a battery to AC power to drive a motor, wherein the inverter includes:
a bulk capacitor configured to be connected to a positive connection of the battery and a negative connection of the battery;
a first phase power module having a first output capacitance and configured to control a first flow of current between the positive connection of the battery, the negative connection of the battery, and a first phase connection of the motor, wherein the first phase power module includes one or more first phase controllers configured to operate in an electromagnetic field with a value greater than 10 A or greater than 100V;
a first decoupling capacitor configured to be connected to the positive connection of the battery and the negative connection of the battery, wherein a value of the first decoupling capacitor is at least one order of magnitude larger than the first output capacitance of the first phase power module;
a second phase power module having a second output capacitance and configured to control a second flow of current between the positive connection of the battery, the negative connection of the battery, and a second phase connection of the motor;
a second decoupling capacitor configured to be connected to the positive connection of the battery and the negative connection of the battery, wherein a value of the second decoupling capacitor is at least one order of magnitude larger than the second output capacitance of the second phase power module;
a third phase power module having a third output capacitance and configured to control a third flow of current between the positive connection of the battery, the negative connection of the battery, and a third phase connection of the motor; and
a third decoupling capacitor configured to be connected to the positive connection of the battery and the negative connection of the battery, wherein a value of the third decoupling capacitor is at least one order of magnitude larger than the third output capacitance of the third phase power module.

10. The system of claim 9,
wherein the first phase power module includes the first decoupling capacitor on the first phase power module,
wherein the second phase power module includes the second decoupling capacitor on the second phase power module, and
wherein the third phase power module includes the third decoupling capacitor on the third phase power module.

11. The system of claim 9,
wherein the first phase power module includes one or more first phase switches, and the one or more first phase controllers are configured to operate the one or more first phase switches,
wherein the second phase power module includes one or more second phase switches, and one or more second phase controllers configured to operate the one or more second phase switches, and
wherein the third phase power module includes one or more third phase switches, and one or more third phase controllers configured to operate the one or more third phase switches.

12. The system of claim 11,
wherein the one or more first phase switches includes one or more silicon carbide dies,
wherein the one or more second phase switches includes one or more silicon carbide dies, and
wherein the one or more third phase switches includes one or more silicon carbide dies.

13. The system of claim 9, wherein the first decoupling capacitor, the second decoupling capacitor, and the third decoupling capacitor are configured to reduce a high-frequency ringing of a switching event of the first phase power module, the second phase power module, and the third phase power module, respectively, relative to an inverter without the first decoupling capacitor, the second decoupling capacitor, and the third decoupling capacitor.

14. The system of claim 9, wherein the switching losses of the first phase power module, the second phase power module, and the third phase power module, respectively, are reduced from approximately 40 mJ to approximately 16 mJ relative to an inverter without the first decoupling capacitor, the second decoupling capacitor, and the third decoupling capacitor.

15. A system comprising:
- a power module for an inverter configured to be connected to a DC power source, the power module including:
  - one or more first controllers configured to operate in an electromagnetic field with a value greater than 10 A or greater than 100V;
  - one or more power switches having a maximum output capacitance and configured to control a flow of current between a first connection of the DC power source, a second connection of the DC power source, and an AC connection; and
  - an integrated decoupling capacitor configured to be connected to the first connection of the DC power source and the second connection of the DC power source, wherein a value of the integrated decoupling capacitor is at least one order of magnitude larger than the maximum output capacitance of the one or more power switches.

16. The system of claim 15, wherein the one or more power switches includes one or more silicon carbide dies.

17. The system of claim 15, wherein the power module includes the integrated decoupling capacitor on the power module.

18. The system of claim 17, wherein the power module includes the integrated decoupling capacitor connected to a DC first connection tab of the power module and a DC second connection tab of the power module.

19. The system of claim 15, wherein a switching loss in the one or more power switches is reduced from approximately 40 mJ to approximately 16 mJ.

20. The system of claim 15, wherein the one or more first controllers are configured to operate the one or more power switches.

* * * * *